(12) United States Patent
Yoo et al.

(10) Patent No.: US 9,660,024 B2
(45) Date of Patent: May 23, 2017

(54) SEMICONDUCTOR DEVICE WITH TWO TRANSISTORS AND A CAPACITOR

(71) Applicant: Samsung Electronics Co., Ltd., Suwon-si (KR)

(72) Inventors: Yong-Ho Yoo, Yongin-si (KR); Tae-jung Park, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/973,649

(22) Filed: Dec. 17, 2015

(65) Prior Publication Data

US 2016/0181251 A1    Jun. 23, 2016

(30) Foreign Application Priority Data

Dec. 18, 2014 (KR) ........................ 10-2014-0183291

(51) Int. Cl.
| | |
|---|---|
| *G11C 11/404* | (2006.01) |
| *H01L 29/06* | (2006.01) |
| *G11C 11/4091* | (2006.01) |
| *H01L 27/108* | (2006.01) |
| *H01L 49/02* | (2006.01) |
| *G11C 11/405* | (2006.01) |
| *G11C 11/56* | (2006.01) |

(52) U.S. Cl.
CPC ........ *H01L 29/0649* (2013.01); *G11C 11/405* (2013.01); *G11C 11/4091* (2013.01); *G11C 11/565* (2013.01); *H01L 27/108* (2013.01); *H01L 27/10844* (2013.01); *H01L 28/90* (2013.01)

(58) Field of Classification Search
CPC ..................................................... G11C 11/404
USPC ......................................................... 365/149
See application file for complete search history.

(56) References Cited

U.S. PATENT DOCUMENTS

| | | |
|---|---|---|
| 4,887,136 A | 12/1989 | Matsuda et al. |
| 4,958,318 A | 9/1990 | Harari |
| 5,136,533 A | 8/1992 | Harari |
| 5,184,324 A | 2/1993 | Ohta |
| 5,283,761 A | 2/1994 | Gillingham |
| 5,293,563 A | 3/1994 | Ohta |
| 5,327,375 A | 7/1994 | Harari |
| 5,351,210 A | 9/1994 | Saito |
| 5,532,955 A | 7/1996 | Gillingham |

(Continued)

FOREIGN PATENT DOCUMENTS

| | | |
|---|---|---|
| EP | 0 503 199 B1 | 4/1997 |
| EP | 0 720 174 B1 | 10/2000 |

(Continued)

*Primary Examiner* — Tha-O H Bui
*Assistant Examiner* — Alfredo Bermudez Lozada
(74) *Attorney, Agent, or Firm* — Muir Patent Law, PLLC

(57) ABSTRACT

A semiconductor device includes a first memory cell including a first transistor and a first capacitor, the first transistor comprising a first gate electrode, a first source, and a first drain; a second memory cell including a second transistor and the first capacitor, the second transistor comprising a second gate electrode, a second source, and a second drain; a first word line coupled to the first gate electrode; and a second word line coupled to the second gate electrode. The first capacitor is electrically connected between the first and second transistors.

15 Claims, 22 Drawing Sheets

(56) References Cited

U.S. PATENT DOCUMENTS

| | | |
|---|---|---|
| 5,606,189 A | 2/1997 | Adan |
| 5,610,855 A | 3/1997 | Komuro |
| 5,612,912 A | 3/1997 | Gillingham |
| 5,640,350 A | 6/1997 | Iga |
| 5,684,736 A | 11/1997 | Chan |
| 5,771,187 A | 6/1998 | Kapoor |
| 5,808,932 A | 9/1998 | Irrinki et al. |
| 5,859,794 A | 1/1999 | Chan |
| 5,909,619 A | 6/1999 | Chi |
| 5,917,748 A | 6/1999 | Chi et al. |
| 5,920,785 A | 7/1999 | Chi et al. |
| 5,978,255 A | 11/1999 | Naritake |
| 5,991,191 A | 11/1999 | Rao |
| 5,995,403 A | 11/1999 | Naritake |
| 6,005,799 A | 12/1999 | Rao |
| 6,018,177 A | 1/2000 | Chi |
| 6,034,885 A | 3/2000 | Chan |
| 6,104,641 A | 8/2000 | Itou |
| 6,141,261 A | 10/2000 | Patti |
| 6,151,237 A | 11/2000 | Naritake |
| 6,151,260 A | 11/2000 | Birk |
| RE37,072 E | 2/2001 | Gillingham |
| 6,184,548 B1 | 2/2001 | Chi et al. |
| 6,282,115 B1 | 8/2001 | Furukawa et al. |
| 6,320,777 B1 | 11/2001 | Lines et al. |
| 6,373,765 B1 | 4/2002 | Birk |
| 6,373,766 B1 | 4/2002 | Birk |
| 6,429,080 B2 | 8/2002 | Furukawa et al. |
| 6,556,469 B2 | 4/2003 | Birk et al. |
| 6,625,075 B2 | 9/2003 | Birk |
| 6,828,612 B2 | 12/2004 | Miyatake et al. |
| 6,969,652 B2 | 11/2005 | Knoedgen |
| 6,992,343 B2 | 1/2006 | Miyatake et al. |
| 7,133,311 B2 | 11/2006 | Liu |
| 7,307,877 B2 | 12/2007 | Knoedgen |
| RE40,075 E | 2/2008 | Gillingham |
| 7,375,548 B2 | 5/2008 | Chang |
| 7,505,302 B2 | 3/2009 | Song |
| 7,542,345 B2 | 6/2009 | Okhonin et al. |
| 7,567,452 B2 | 7/2009 | Song et al. |
| 7,724,569 B2 | 5/2010 | Kang et al. |
| 8,031,512 B2 | 10/2011 | Kye et al. |
| 8,090,980 B2 | 1/2012 | Danilak |
| 8,329,534 B2 | 12/2012 | Doebler |
| 8,329,535 B2 | 12/2012 | Wu |
| 8,471,320 B2 | 6/2013 | Lee et al. |
| 8,773,925 B2 | 7/2014 | Koya et al. |
| 2002/0141223 A1* | 10/2002 | Kang ............... G11C 11/22 365/145 |
| 2004/0032785 A1 | 2/2004 | Birk |
| 2004/0184298 A1* | 9/2004 | Takahashi ......... G11C 11/405 365/62 |
| 2006/0044018 A1 | 3/2006 | Chang |
| 2007/0008767 A1* | 1/2007 | Murakami ............ G11C 8/14 365/145 |
| 2007/0139994 A1 | 6/2007 | Song et al. |
| 2007/0140005 A1 | 6/2007 | Song |
| 2007/0195619 A1 | 8/2007 | Rhie et al. |
| 2009/0168558 A1 | 7/2009 | Kang et al. |
| 2010/0008139 A1 | 1/2010 | Bae |
| 2011/0127580 A1 | 6/2011 | Park et al. |
| 2012/0099368 A1 | 4/2012 | Kamata |
| 2013/0069220 A1 | 3/2013 | Doebler |

FOREIGN PATENT DOCUMENTS

| | | |
|---|---|---|
| EP | 0 720 176 B1 | 6/2003 |
| JP | H8-180688 A | 7/1996 |
| JP | H10-097791 A | 4/1998 |
| JP | 3085280 B2 | 9/2000 |
| JP | 2003-273245 A | 9/2003 |
| JP | 3771617 B2 | 4/2006 |
| JP | 2007-164977 A | 6/2007 |
| JP | 2007-164978 A | 6/2007 |
| JP | 2009-163855 A | 7/2009 |
| JP | 5066727 B2 | 11/2012 |
| JP | 5496184 B2 | 5/2014 |
| KR | 10-0177783 | 5/1999 |
| KR | 10-0226951 | 10/1999 |
| KR | 10-2000-0004509 | 1/2000 |
| KR | 10-0251217 | 1/2000 |
| KR | 10-0249417 | 3/2000 |
| KR | 10-0275642 | 12/2000 |
| KR | 10-0287314 | 4/2001 |
| KR | 10-0335537 | 5/2002 |
| KR | 10-2002-0061257 | 7/2002 |
| KR | 10-0337202 | 11/2002 |
| KR | 10-0674105 | 1/2007 |
| KR | 10-0678643 | 1/2007 |
| KR | 10-0691818 | 3/2007 |
| KR | 10-0744132 | 7/2007 |
| KR | 10-0772723 | 10/2007 |
| KR | 10-0800154 | 2/2008 |
| KR | 10-0800156 | 2/2008 |
| KR | 10-0843139 | 6/2008 |
| KR | 10-0844946 | 7/2008 |
| KR | 10-0844947 | 7/2008 |
| KR | 10-0861170 | 9/2008 |
| KR | 10-0861190 | 9/2008 |
| KR | 10-2009-0002803 | 1/2009 |
| KR | 10-0892732 | 4/2009 |
| KR | 10-0919584 | 9/2009 |
| KR | 10-0919558 | 10/2009 |
| KR | 10-0919559 | 10/2009 |
| KR | 10-0964255 | 6/2010 |
| KR | 10-1004566 | 1/2011 |
| KR | 10-1091010 | 12/2011 |
| KR | 10-2013-0141512 | 12/2013 |
| KR | 10-1372307 | 3/2014 |
| KR | 10-1377068 | 3/2014 |
| KR | 10-1498873 | 3/2015 |

* cited by examiner

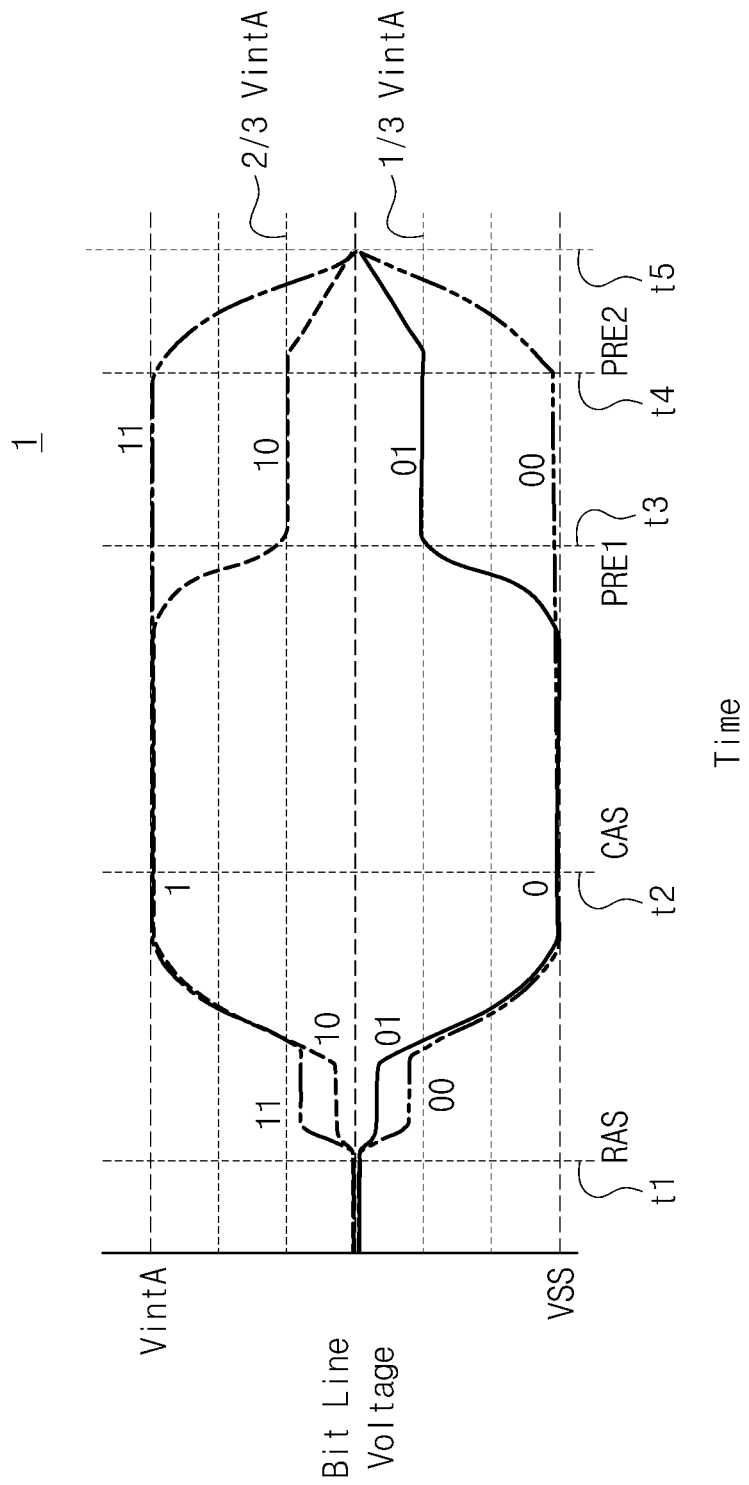

SEMICONDUCTOR DEVICE WITH TWO TRANSISTORS AND A CAPACITOR

CROSS-REFERENCE TO RELATED APPLICATIONS

This U.S. non-provisional patent application claims priority under 35 U.S.C. §119 to Korean Patent Application No. 10-2014-0183291, filed on Dec. 18, 2014, in the Korean Intellectual Property Office, the contents of which are hereby incorporated by reference in their entirety.

BACKGROUND

1. Technical Field

Example embodiments of the inventive concept relate to a semiconductor device, and in particular, to a semiconductor device with a capacitor.

2. Description of the Related Art

In dynamic random access memories (DRAMs), for example, a capacitor is normally associated with each memory cell. As a semiconductor device becomes more highly integrated and scaled down in size, a capacitor having sufficient capacitance in a limited area is important. An electrostatic capacitance of a capacitor is proportional to a surface area of an electrode and a dielectric constant of a dielectric film and is inversely proportional to an equivalent oxide thickness of the dielectric film. This means that the capacitance of a capacitor can be increased by, for example, forming a larger three dimensional electrode that increases a surface area thereof, decreasing an equivalent oxide thickness of the dielectric film, and/or using a dielectric film having a higher dielectric constant.

SUMMARY

Some example embodiments of the inventive concept include a semiconductor device that includes a capacitor with a high electrostatic capacitance.

Some example embodiments of the inventive concept include a method of fabricating a semiconductor device that includes a capacitor with a high electrostatic capacitance.

According to some example embodiments, a semiconductor device includes a first memory cell, a second memory cell, a first word line, and a second word line. The first memory cell includes a first transistor and a first capacitor, the first transistor comprising a first gate electrode, a first source, and a first drain. The second memory cell includes a second transistor and the first capacitor, the second transistor comprising a second gate electrode, a second source, and a second drain. The first word line is coupled to the first gate electrode, and the second word line is coupled to the second gate electrode. The first capacitor is electrically connected between the first and second transistors.

According to some example embodiments, the first word line, second word line, and first capacitor are all formed on the same active region in a substrate, the active region defined by a device isolation layer.

According to some example embodiments, the semiconductor device further comprises a first bit line coupled to the first drain to cross the first and second word lines, and a second bit line coupled to the second drain and disposed parallel to the first bit line. The first capacitor is shared by the first and second memory cells and is coupled in common to the first and second sources.

In some embodiments, the semiconductor device further includes a third transistor including a third gate electrode, a third drain, and a third source; a fourth transistor including a fourth gate electrode, a fourth drain, and a fourth source; a third word line and a fourth word line disposed parallel to the second word line; and a third bit line disposed parallel to the second bit line. The third gate electrode is coupled to the third word line, the third drain is coupled to the third bit line, the fourth gate electrode is coupled to the fourth word line, and the fourth drain is coupled to the second bit line. The third and fourth sources may be coupled in common to a second capacitor.

In some embodiments, the first capacitor and the second capacitor are disposed as part of a honeycomb or zigzag arrangement, when viewed in a plan view with other similarly coupled capacitors in a memory cell array.

In some embodiments, the semiconductor device additionally includes a first sense amplifier unit, and a second sense amplifier unit, wherein the first sense amplifier unit is connected to the first and third bit lines, and the second sense amplifier unit is connected to the second bit line.

According to some embodiments, the semiconductor device further includes a first storage node contact electrically connected to the first capacitor and contacting both of the first and second sources, and a second storage node contact electrically connected to the second capacitor and contacting both of the third and fourth source electrodes. The first and second storage node contacts may be disposed as part of a honeycomb or zigzag arrangement, when viewed in a plan view with other similarly connected storage node contacts in a memory cell array.

In some aspects of the disclosed embodiments, a semiconductor device includes a substrate including an active region, which is defined by a device isolation layer, to extend in a third direction that is non-parallel and non-perpendicular to first and second directions, which are perpendicular to each other. The device additionally includes word lines arranged in the substrate in the first direction, the word lines extending in the second direction to cross the active region, and bit lines arranged on the substrate in the second direction, the bit lines extending in the first direction to cross the active region. The device may additionally include storage node contacts disposed on the active region between the bit lines, each of the storage node contacts contacting at least a first source/drain region and a second source/drain region, the first source/drain region and second source/drain region positioned at opposite sides of one of the word lines.

According to some embodiments, the semiconductor device additionally includes capacitors provided on the storage node contacts, respectively. The storage node contacts may contact the capacitors, respectively, such that the capacitors are coupled between a first transistor coupled to a first word line of the word lines and a second transistor coupled to a second word line of the word lines.

According to some embodiments, each of the capacitors is disposed to cross a corresponding one of the word lines and is positioned between the bit lines, when viewed in a plan view. When viewed in a plan view, the capacitors may be disposed to have a honeycomb or zigzag arrangement.

In certain embodiments, the active region is provided to have a line- or bar-shaped structure, when viewed in a plan view.

In certain embodiments, the semiconductor device additionally includes node contacts disposed between the bit lines and the active region and contacting the source/drain regions. The node contacts may comprise a first node contact and a second node contact facing each other in the third direction, and the source/drain regions may comprise a first source region adjacent to the first node contact, a first drain region in contact with the first node contact, a second source region adjacent to the second node contact, and a second drain region in contact with the second node contact.

According to some embodiments, the first source region and the second source region are disposed between the first and second node contacts and both contact a corresponding one of the storage node contacts.

According to some embodiments, certain first source/drain regions and second source/drain regions are spaced apart from each other by word lines.

According to some embodiments, the semiconductor device may additionally include a first memory cell and a second memory cell. The first memory cell may include a first transistor and a first capacitor, the first transistor comprising a first gate electrode, a first source region, and a first drain region. The second memory cell may include a second transistor and the first capacitor, the second transistor comprising a second gate electrode, a second source region, and a second drain region. A first word line of the word lines may be coupled to the first gate electrode, a second word line of the word lines may be coupled to the second gate electrode, and the first capacitor may contact a first storage node capacitor of the storage node capacitors, such that the first capacitor is electrically connected between the first and second transistors.

According to certain embodiments, the first memory cell, the second memory cell, and the first capacitor may be part of a multi-level memory cell configured to store data of two or more bits.

According to certain aspects of the disclosed embodiments, a multi-level memory cell configured to store data of two or more bits includes a first transistor, a second transistor, a first capacitor electrically and physically between the first and second transistors, a first word line, and a second word line. The first transistor includes a first gate electrode, a first source, and a first drain. The second transistor includes a second gate electrode, a second source, and a second drain. The first word line is coupled to the first gate electrode, and the second word line is coupled to the second gate electrode. The first transistor, second transistor, and first capacitor may be formed along an active region extending in a direction different from the first word line and the second word line.

In some embodiments, a third word line is physically between the first and second word lines.

BRIEF DESCRIPTION OF THE DRAWINGS

Example embodiments may be more clearly understood from the following brief description taken in conjunction with the accompanying drawings. The accompanying drawings represent non-limiting, example embodiments as described herein.

FIGS. 1B and 1C are operation timing diagrams exemplarily illustrating a sensing operation of the sense amplifiers (S/As) shown in FIG. 1A, according to example embodiments.

FIGS. 3A through 9A are plan views illustrating a method of fabricating a semiconductor device according to example embodiments of the inventive concept.

FIGS. 3B through 9B are cross-sectional views taken along lines I-I', II-II' and III-III' of FIGS. 3A through 9A, respectively, to illustrate a method of fabricating a semiconductor device according to example embodiments of the inventive concept.

Figure 1A:
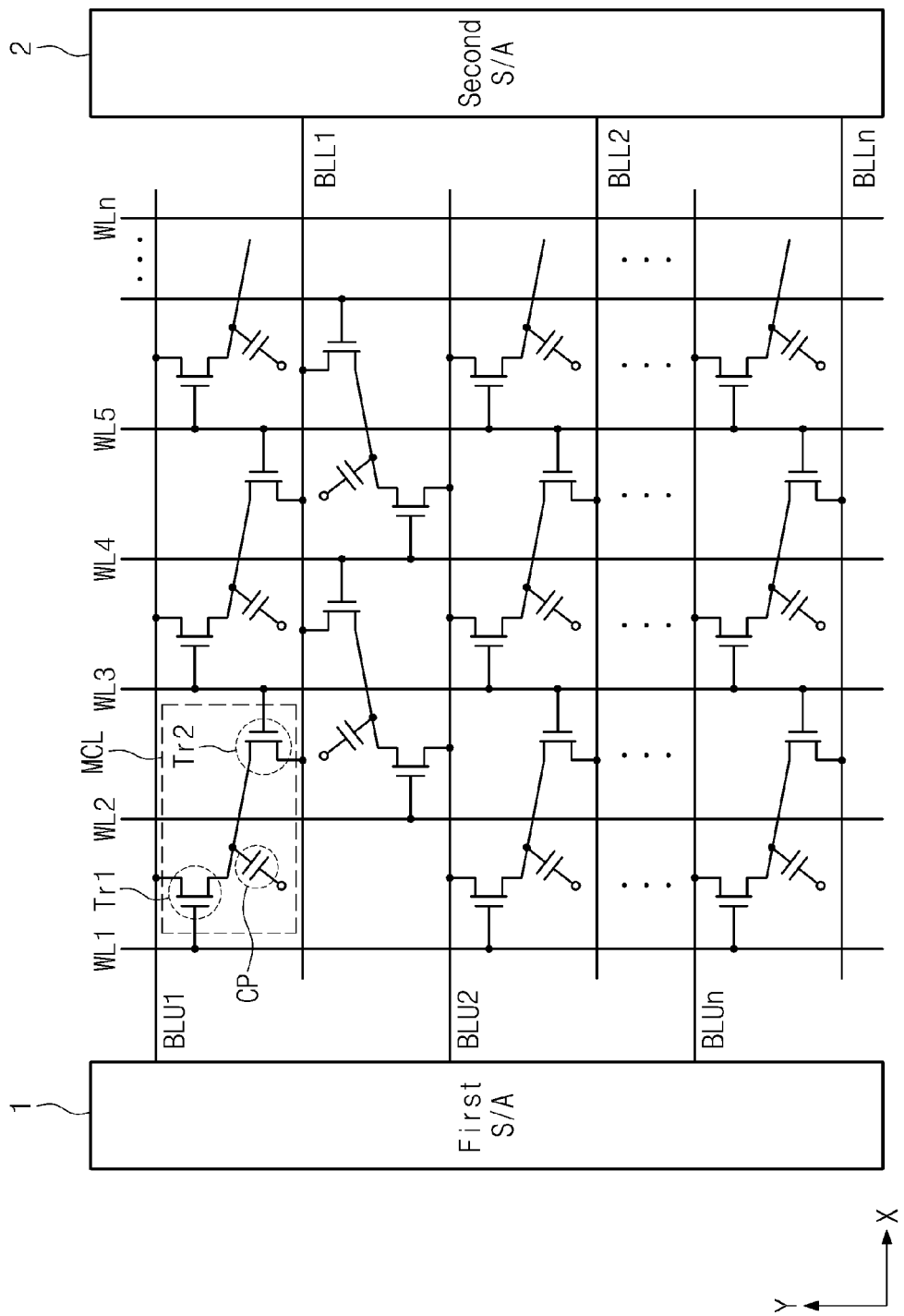
FIG. 1A is a circuit diagram exemplarily illustrating a memory cell array of a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the example embodiments set forth herein. These example embodiments are just that— examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the thicknesses of layers and regions are exaggerated for clarity. Like reference numerals and numbers in the drawings denote like elements throughout, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or"

includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). However, the term "contact," as used herein refers to direct contact (i.e., touching) unless the context indicates otherwise.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may be orthogonal to each other, but the plan view may include an additional, fourth direction that is not orthogonal to the two directions. The three different directions may include a third direction that may be orthogonal to the two different directions. The plurality of device structures may be integrated in a same electronic device. For example, when a device structure (e.g., a memory cell structure, active region, or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, a semiconductor device may refer to any of the various devices such as shown in FIGS. 1A-9B, and may also refer, for example, to one or more transistors or memory cells, or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, a hard drive including additional components, or a mobile phone, laptop, tablet, desktop, camera, or other consumer electronic device, etc.

Figure 1C:
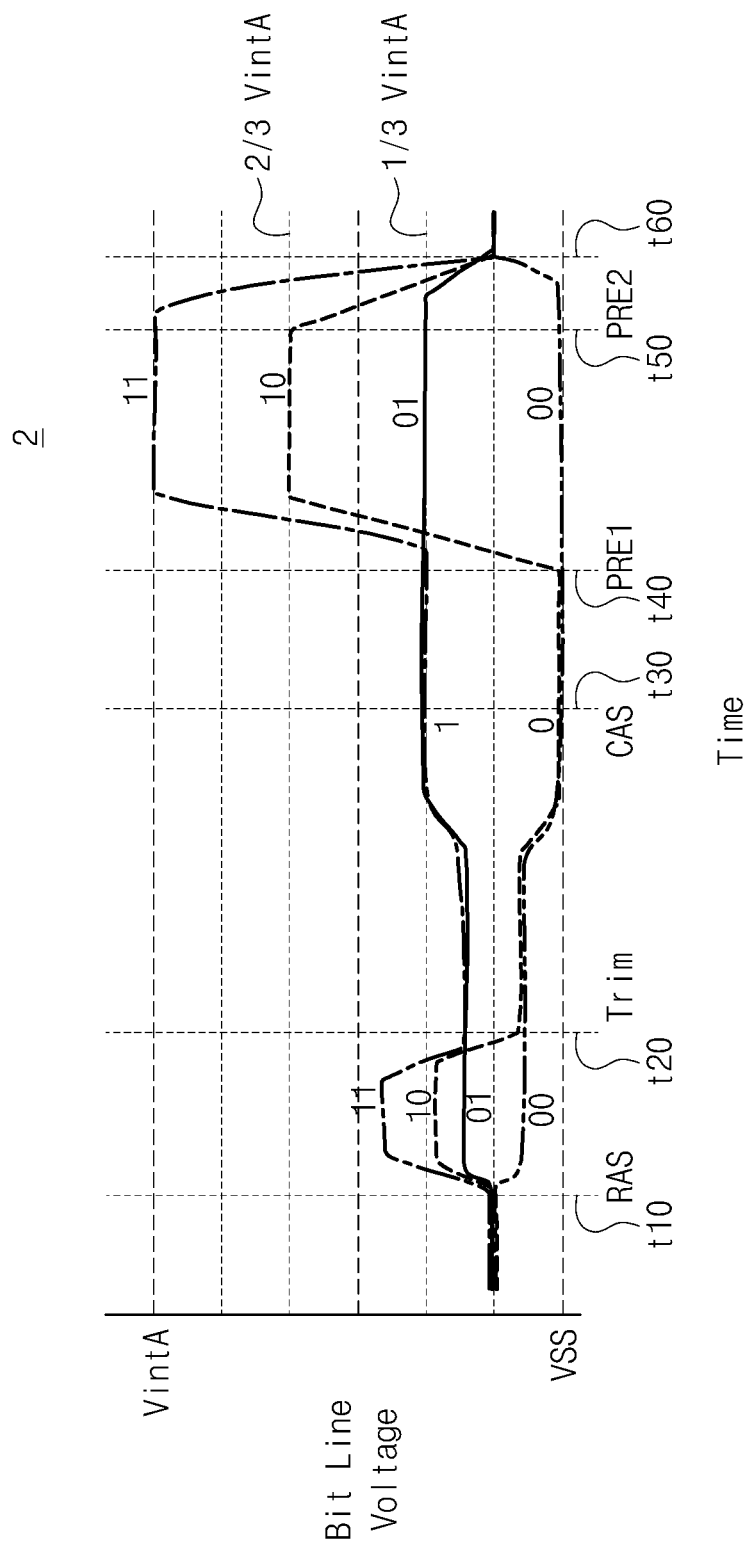

FIG. 1A is a circuit diagram exemplarily illustrating a memory cell array of a semiconductor device according to example embodiments of the inventive concept, and FIGS. 1B and 1C are operation timing diagrams exemplarily illustrating a sensing operation of the sense amplifiers shown in FIG. 1A.

First, referring to FIG. 1A, a memory cell array of a semiconductor device (e.g., DRAM) may include a plurality of multi-level memory cells MLCs, each of which is configured to store data of two or more bits. For example, a multi-level memory cell MLC may include a first transistor Tr1 connected to one word line (e.g., a first word line WL1), a second transistor Tr2 connected to another word line (e.g., a third word line WL3), and a capacitor CP.

Here, to form the multi-level memory cell MLC, which is configured to store data of two or more bits, along with the first and second transistors Tr1 and Tr2, the capacitor CP may be connected in common to the first and second transistors Tr1 and Tr2. Thus, the capacitor CP may serve as a memory element of the multi-level memory cell MLC.

Since a pair of access transistors is connected to a single capacitor, the first transistor Tr1 and the capacitor CP may be referred to as a first memory cell and the second transistor Tr2 and the capacitor CP may be referred to as a second memory cell. A multi-level memory cell MLC in the memory cell array may therefore be comprised of the first memory cell and the second memory cell, the two MLCs having one, shared capacitor CP.

The first and second transistors Tr1 and Tr2 may be connected to the first and second sense amplifier (S/A) units 1 and 2, respectively, through first and second bit lines BLU1 and BLL1.

To sense multi-bit data stored in each capacitor, the first and second sense amplifier units 1 and 2 may be configured to perform different sensing operations, as shown in FIGS. 1B and 1C.

In the present specification, the term "multi-level memory cell" may refer to an MLC memory cell configured to store data of two or more bits. For example, the term "multi-level memory cell" may refer to a dual-level memory cell DLC storing data of two bits, a tri-level memory cell TLC storing data of three bits, or a quad-level memory cell QLC storing data of four bits.

The first sense amplifier unit 1 may include a first data compensation circuit (not shown), which may be configured to perform an operation of refreshing data of a memory cell to an original level, after a first sensing operation performed by the first sense amplifier unit 1. The original level may represent, for example, a level used to store data (e.g., MLC data).

The second sense amplifier unit 2 may include a second data compensation circuit (not shown), which may be configured to perform an operation of refreshing data of a memory cell to an original level, after a second sensing operation performed by the second sense amplifier unit 2. The second sense amplifier unit 2 may further include a data trimming circuit (not shown), which may be configured to convert a level of data stored in a selected memory cell to a predetermined trimming level set in the sensing operation.

The first sense amplifier unit 1 may be configured to perform first and second pre-charging cycles, during a sensing operation cycle of FIG. 1B, and the second sense amplifier unit 2 may be configured to perform first and second pre-charging cycles and a trimming cycle, during a sensing operation cycle of FIG. 1C.

As shown in FIG. 1A, in the case where each of the multi-level memory cells has two transistors and only one capacitor (i.e. one, MLC capacitor as opposed to, conventionally, two capacitors for the two transistors), it is possible to maintain a design rule for a semiconductor device and secure a margin for a planar scaling of a capacitor. This makes it possible to relieve technical difficulties in a deep and narrow etching process and consequently improve an overall yield of a fabrication process.

In FIG. 1A, a plurality of word lines WL1, WL2, WL3, WL4, WL5, . . . , and WLn may be arranged in a first direction X, and a plurality of bit lines BL may be arranged in a second direction Y perpendicular to the first direction X to cross the word lines WL1, WL2, WL3, WL4, WL5, . . . , and WLn. Accordingly, the memory cell array may have a matrix shape. The bit lines BL may include upper bit lines BLU1, BLU2, . . . , and BLUn and lower bit lines BLL1, BLL2, . . . , and BLLn. In some embodiments, the upper bit lines BLU1, BLU2, . . . , and BLUn and the lower bit lines BLL1, BLL2, . . . , BLLn may be alternatingly and repeatedly arranged. The terms upper and lower here may be used simply as a naming convention.

Both of the first and second transistors Tr1 and Tr2 may be disposed in each unit region, such as where three adjacent word lines and two adjacent bit lines cross each other. For example, a unit region may be a region where two transistors and one capacitor are disposed, which collectively form a multi-level cell MLC. The first transistors Tr1 may be connected to odd-numbered word lines WL1, WL3, WL5, . . . , WLn−1 and the upper bit lines BLU1, BLU2, . . . , and BLUn, while the second transistors Tr2 may be connected to the odd-numbered word lines and the lower bit lines BLL1, BLL2, . . . , and BLLn.

In detail, drain regions of the first transistors Tr1 arranged along the first direction X may be connected to the same one of the bit lines. Drain regions of the first transistors Tr1 arranged along the second direction Y may be respectively coupled to different ones of the bit lines. Source regions of the first transistors Tr1 may be coupled to the capacitors, respectively (e.g., a first electrode of each respective capacitor). A second electrode of the capacitors may be connected to receive a plate voltage VPL.

Drain regions of the second transistors Tr2 arranged along the first direction X may be connected to the same one of the bit lines. Drain regions of the second transistors Tr2 arranged along the second direction Y may be respectively coupled to different ones of the bit lines. Further, each of the source regions of the second transistors Tr2 may be connected to the capacitor CP (e.g., the first electrode of each respective capacitor), which is coupled to a source region of a corresponding one of the first transistors Tr1 (i.e., adjacent to the second transistors Tr2 of a same multi-level memory cell MLC). Thus, each of the capacitors CP may be connected in common to (e.g. in between) a pair of access transistors (e.g. first and second transistors Tr1 and Tr2 of the same multi-level memory cell MLC).

For example, the gate and drain regions of the first transistor Tr1, which are coupled to the first word line WL1 and the first upper bit line BLU1, respectively, the gate and drain regions of the second transistor Tr2, which are coupled to the third word line WL3 and the first lower bit line BLL1, respectively, and the source regions of the first and second transistors Tr1 and Tr2, may be coupled to the capacitor CP.

Both of third and fourth transistors Tr3 and Tr4 may be disposed in each of the unit regions. The third transistors Tr3 may be connected to the even-numbered word lines WL2, WL4, . . . , WLn and the lower bit lines BLL1, BLL2, . . . , and BLLn, while the fourth transistors Tr4 may be connected to the even-numbered word lines WL4, WL6, . . . , WLn and the upper bit lines BLU1, BLU2, . . . , and BLUn.

In detail, drain regions of the third transistors Tr3 arranged along the first direction X may be connected to the same one of the bit lines. Drain regions of the third transistors Tr3 arranged along the second direction Y may be respectively coupled to different ones of the bit lines. Source regions of the third transistors Tr3 may be coupled to the capacitors, respectively.

Drain regions of the fourth transistors Tr4 arranged along the first direction X may be connected to the same one of the bit lines. Drain regions of the fourth transistors Tr4 arranged along the second direction Y may be respectively coupled to different ones of the bit lines. Further, each of the source regions of the fourth transistors Tr4 may be connected to the capacitor CP, which is coupled to a source region of a corresponding one of the third transistors Tr3 (i.e., adjacent to the fourth transistor Tr4 of a same multi-level memory cell MLC). Accordingly, each of the capacitors CP may be connected in common to a pair of access transistors.

For example, the gate and drain regions of the third transistor Tr3, which are coupled to the fourth word line WL4 and the first lower bit line BLL1, respectively, and the gate and drain regions of the fourth transistor Tr4, which are coupled to the second word line WL2 and the second upper bit line BLU2, respectively, and the source regions of the third and fourth transistors Tr3 and Tr4 may be coupled to another one of the capacitors CP.

The capacitors CP may be disposed in the memory cell array to have a honeycomb or zigzag arrangement, but the inventive concept is not limited to such an example embodiment. The upper bit lines BLU1, BLU2, . . . , and BLUn may be connected to the first sense amplifier unit 1, and the lower bit lines BLL1, BLL2, . . . , and BLLn may be connected to the second sense amplifier unit 2. For example, in the case where the first transistor Tr1 connected to the first upper bit line BLU1 and the first word line WL1 is accessed, electric charges stored in the capacitor CP may be transferred to and sensed by the first sense amplifier unit 1 through the first upper bit line BLU1. Similarly, in the case where the second transistor Tr2 connected to the first lower bit line BLL1 and the second word line WL2 is accessed, electric charges stored in the capacitor CP may be transferred to and sensed by the second sense amplifier unit 2 through the first lower bit line BLL1.

Hereinafter, an example of a sensing operation of the first and second sense amplifier units 1 and 2 will be described in more detail with reference to FIGS. 1B and 1C.

If a first memory cell with the first transistor Tr1 and the capacitor CP is selected in a read operation, operation timing shown in FIG. 1B may be used to perform a sensing operation in the first sense amplifier unit 1.

Similarly, if a second memory cell with the second transistor Tr2 and the capacitor CP is selected in the read operation, operation timing shown in FIG. 1C may be used to perform a sensing operation in the second sense amplifier unit 2.

Referring to FIG. 1B, if at time t1, a read command, a row address strobe (RAS) signal, and an address signal are provided to a semiconductor device, a word line of a memory cell array is selected. Hereinafter, for brevity, suppose that the first word line WL1 is selected. If the first word line WL1 is selected, the first transistor Tr1 may be turned on. Electric charges serving as data may be stored in the capacitor CP or between a storage node and a plate node, to which a plate voltage VPL is applied. Thus, if the first transistor Tr1 is turned on, electric charges stored in the capacitor CP may be delivered to the first upper bit line BLU1 through a drain-source channel of the first transistor Tr1. As a result of such a charge sharing, the first upper bit line BLU1 may have an electric potential that is different from a pre-charging level before t1, which may be, e.g., a half level of the array internal power voltage, e.g., ½ VintA, after the time t1. For example, the electric potential of the first upper bit line BLU1 may be increased or decreased, depending on an amount of electric charges stored in the capacitor CP. For example, if data stored in the first memory cell is one of four logic states, e.g., "01" as shown by the solid line of FIG. 1B, the electric potential (voltage) of the first upper bit line BLU1 may have a third-highest level in a range between time t1 and time t2. Further, if the data stored in the first memory cell is another one of the four logic states, e.g., "00", the electric potential of the first upper bit line BLU1 may have the lowest level in a range between t1 and t2. Here, in the first upper bit line BLU1, electric potential levels that correspond to the logic states of "00" and "01" may be developed by the first sense amplifier unit 1 to an electric potential that corresponds a logic-level "0", while electric potential levels that correspond to the logic states of "10" and "11" may be developed by the first sense amplifier unit 1 to an electric potential that corresponds a logic-level "1". For example, four electric potential levels (voltages) may be reduced to two potential levels, as shown in FIG. 1B.

The first sense amplifier unit 1 may sense data stored in the selected first memory cell to "0" or "1", by sensing an electric potential of the first upper bit line BLU1, which is fully developed just before t2, using a reference voltage level of ½ VintA. In other words, the first sense amplifier unit 1 may output one bit of data as its sensing output data.

After the sensing operation, if at time t2 a column address strobe signal CAS is applied, a column selection gate may be enabled to select the corresponding bit line. Accordingly, data sensed at the time t2 may be stored in a data output buffer through a local bit line and a global bit line and then may be read out to the outside of the semiconductor device.

A first pre-charging operation may begin at time t3. The first pre-charging operation may refer to a data refresh operation, which is performed to re-store original data of the selected first memory cell to the first memory cell, after the sensing operation. For example, if the original data (i.e. electric potential corresponding to a logic state) was "01", electric charges, whose amount corresponds to the "01" data, may be re-stored in the shared capacitor of the first memory cell. In certain embodiments, for this example provided by the solid line in FIG. 1B, a voltage level for the restoring operation may be ⅓ VintA.

The restore operation of refreshing data to its initial level may be performed by the first data compensation circuit.

Next, a second pre-charging operation may begin at time t4. The second pre-charging operation may refer to an operation of restoring the electric potential of the first upper bit line BLU1 to the half level of the array internal power voltage, e.g., ½ VintA. This makes it possible to maintain a pre-charging level, at time t5, of the first upper bit line BLU1 to the same level, e.g., ½ VintA, as that before the time t1.

For the first sense amplifier unit 1, the sensing operation cycle including RAS-CAS-PRECHARGE may further include a first pre-charging cycle for refreshing data.

Referring to FIG. 1C, if at time t10, a read command, a row address strobe (RAS) signal, and an address signal are provided to a semiconductor device, a word line of a memory cell array is selected. Hereinafter, for brevity, suppose that the third word line WL3 is selected. If the third word line WL3 is selected, the second transistor Tr2 of the first memory cell may be turned on. Thus, if the second transistor Tr2 is turned on, electric charges stored in the capacitor CP may be delivered to the first lower bit line BLL1 through a drain-source channel of the second transistor Tr2. As a result of such a charge sharing, after the time t10, the first lower bit line BLL1 may have an electric potential that is different from a pre-charging level of ⅙ VintA before the time t10. As such, the electric potential of the first lower bit line BLL1 may be increased or decreased, depending on an amount of electric charges stored in the capacitor CP.

For example, if data stored in the second memory cell is one of four logic states, e.g., "01", the electric potential of the first lower bit line BLL1 may have a third-highest level in a range between time t10 and time t20. Further, if the data stored in the second memory cell is another one of the four logic states, e.g., "00", the electric potential of the first lower bit line BLL1 may have the lowest level in a range between t10 and t20.

At t20, a trimming operation may be performed by a trimming circuit. During the data read operation, the trimming circuit may be configured to trim a level of data, depending on an initial amount electric charge stored in the capacitor, and such a trimming may help facilitate the sensing operation. As a result of the trimming, in the first lower bit line BLU1, electric potential levels that correspond to the logic states of "00" and "10" may be developed by the second sense amplifier unit 2 to an electric potential that corresponds a logic-level "0", while electric potential levels that correspond to the logic states of "01" and "11" may be developed by the second sense amplifier unit 2 to an electric potential that corresponds a logic-level "1". Therefore, four electric potential levels (voltages) may be reduced to two potential levels, as shown in FIG. 1C. Although FIGS. 1B and 1C show only two bits of data being stored as the different levels (corresponding to the logic states) in each of the capacitors CP, the inventive concept is not so limited, and may be applied to the storing of three and even four bits of data in the capacitors of each multi-level memory cell.

The second sense amplifier unit 2 may sense data stored in the selected second memory cell to logic-level "0" or "1", by sensing the electric potential of the first lower bit line BLL1, just before time t30, using a reference voltage level of ⅙ VintA. For example, the second sense amplifier unit 2 may output one bit of data as its sensing output data.

After the sensing operation, if at t30 a column address strobe signal CAS is applied, a column selection gate may be enabled to select the corresponding bit line. Accordingly, data sensed directly before t30 may be stored in a data output buffer through a local bit line and a global bit line and then may be read out to the outside of the semiconductor device.

At time t40, a first pre-charging operation may begin. The first pre-charging operation may refer to a data refresh operation, which is performed to re-store original data of the selected second memory cell to the second memory cell, after the sensing operation. For example, if a logic state of the sensed data was "01", electric charges, whose amount corresponds to the potential level to represent the "01" logic state, may be re-stored in the shared capacitor of the second memory cell. For the example provided by the solid line of FIG. 1C, a voltage level for the restoring operation may be ⅓ VintA. The restore operation of refreshing data to the original data may be performed by the second data compensation circuit.

Next, a second pre-charging operation may be performed at t50. The second pre-charging operation may refer to an operation of restoring an electric potential of the first lower bit line BLL1 to the level of ⅙ VintA. Accordingly, at time t60, the pre-charging level of the first lower bit line BLL1 may be returned to the same level, e.g., ⅙ VintA, as that before t10.

For the second sense amplifier unit 20, the sensing operation cycle including RAS-CAS-PRECHARGE may further include a data trimming operation and a first pre-charging cycle for refreshing data.

Figure 2A:
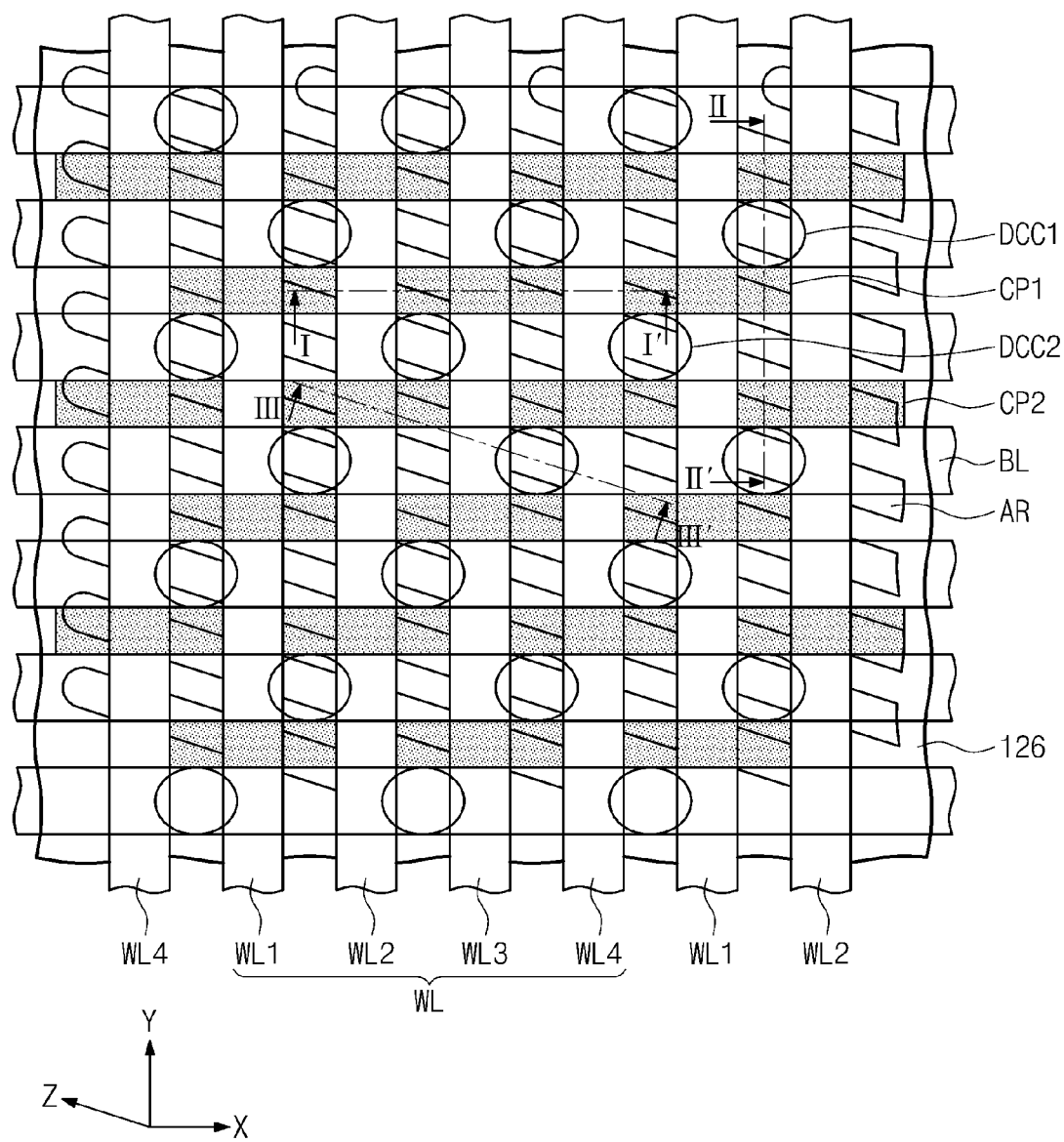
FIG. 2A is a plan view illustrating a semiconductor device according to example embodiments of the inventive concept.
Figure 2B:
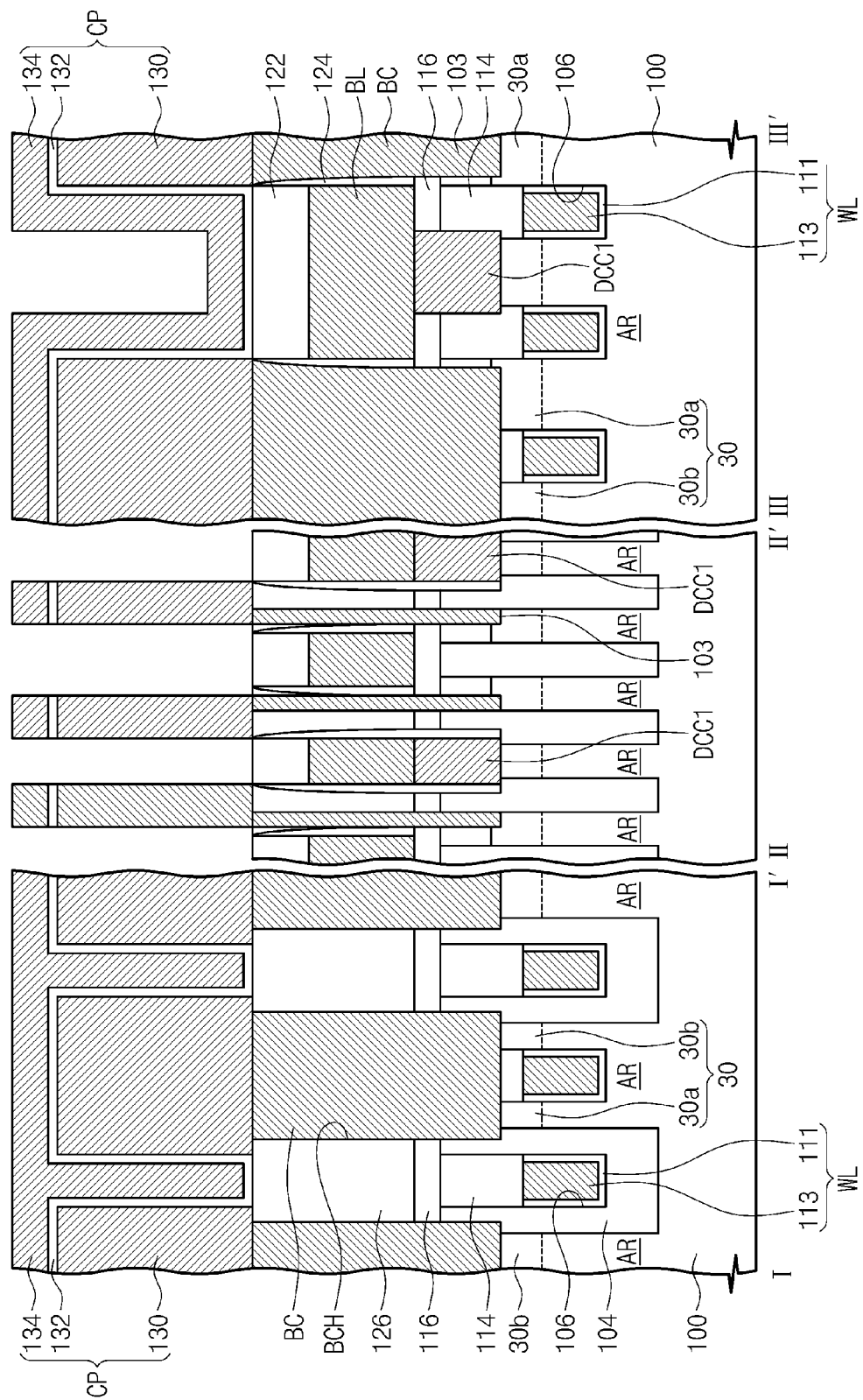
FIG. 2B is a cross-sectional view taken along lines I-I', II-II', and III-III' of FIG. 2A to illustrate a semiconductor device according to example embodiments of the inventive concept.

Hereinafter, a method for fabricating the memory cell of FIG. 1A will be exemplarily described. The description of the method may provide a better understanding of example embodiments of the inventive concept. FIG. 2A is a plan view illustrating a semiconductor device according to example embodiments of the inventive concept. FIG. 2B is a cross-sectional view taken along lines I-I', II-II', and III-III' of FIG. 2A to illustrate a semiconductor device according to example embodiments of the inventive concept.

Referring to FIGS. 2A and 2B, a device isolation layer 104 including an insulating material may be formed in a substrate 100. The device isolation layer 104 may be formed to define a plurality of active regions AR. The plurality of active regions AR may be formed parallel to each other, and each of them may be shaped like a bar extending in a third direction Z. The third direction Z may be non-parallel and non-perpendicular to a first direction X and a second direction Y.

Word lines WL may be provided in the substrate 100 to cross the active region AR. The word lines WL may cross the active region AR in the second direction Y. The word lines WL may include a plurality of word line groups, each of which includes first to fourth word lines WL1 to WL4 sequentially disposed along the first direction X. The word lines WL may be buried in the substrate 100. Each of the word lines WL may include a gate insulating pattern 111 and a gate electrode pattern 113. The gate insulating pattern 111 may be provided to conformally cover bottom and side surfaces of the gate electrode pattern 113. A buffer insulating pattern 114 may be provided on the word lines WL. The buffer insulating pattern 114 may be buried in the substrate 100 to have a top surface exposed near a top surface of the substrate 100. For example, the buffer insulating pattern 114 may have a top surface positioned at the same level as that of the substrate 100.

Source/drain regions 30 may be provided in the active region AR of the substrate 100. The source/drain regions 30 may be doped to form impurity regions in the substrate 100. The source/drain regions 30 may be formed adjacent to upper portions of the word lines WL.

A first interlayer insulating layer 116 may be provided on the substrate 100. The first interlayer insulating layer 116 may cover the source/drain regions 30 and the buffer insulating pattern 114.

Node contacts DCC may be provided on the active region AR of the substrate 100. The node contacts DCC may penetrate the first interlayer insulating layer 116, the buffer insulating pattern 114, a sacrificial pattern 103, and a portion of the substrate 100 and may be in contact with the source/drain regions 30, respectively. For example, a node contact DCC may be in contact with a drain of the first (or third) transistor Tr1 (or Tr3) and another node contact may be in contact with a drain of the second (or fourth) transistor Tr2 (or Tr4). When viewed in a plan view, the node contacts DCC may be provided on the active region AR exposed between the word lines WL. The node contacts DCC may have a top surface positioned at the same level as that of the first interlayer insulating layer 116. The node contacts DCC may include first node contacts DCC1 and second node contacts DCC2.

In example embodiments, when viewed in a plan view, the first node contacts DCC1 may be provided on the active regions AR, respectively, which are exposed between the first and second word lines WL1 and WL2 and between the third and fourth word lines WL3 and WL4. The second node contacts DCC2 adjacent to the first node contacts DCC1 in the third direction Z may be provided on the active regions AR, respectively, which are exposed between the second and third word lines WL2 and WL3 and between the fourth and first word lines WL4 and WL1. For example, on the same active region AR, the first and second node contacts DCC1 and DCC2 may be alternatingly disposed in the third direction Z, their coordinates in the second direction Y being different from each other. When viewed in a plan view, the node contacts DCC (i.e. first and second node contacts DCC1 and DCC2) may be disposed to have a honeycomb or zigzag arrangement.

The bit lines BL may be formed on the first interlayer insulating layer 116 to cross the active region AR. The bit lines BL may cross the active region AR in the first direction X perpendicular to the second direction Y. Each of the bit lines BL may be electrically connected to the node contacts DCC arranged along the first direction X or disposed thereunder. As an example, one of the bit lines BL (e.g. BLU1) may cross over the first node contacts DCC1 arranged along the first direction X. Another of the bit lines BL (e.g. BLL1) may cross over the second node contacts DCC2 arranged along the first direction X. The bit lines BL in the Y direction may be alternatingly and repeatedly arranged between the upper bit lines BLU1, BLU2, . . . , and BLUn and the lower bit lines BLL1, BLL2, . . . , BLLn.

An insulating pattern 122 may be provided on the bit lines BL. Spacers 124 may be formed on sidewalls of the bit lines BL. The spacer 124 may be extended to cover at least sidewalls of the node contacts DCC and the insulating pattern 122. A second interlayer insulating layer 126 may be formed on the first interlayer insulating layer 116 to cover the bit lines BL. Second interlayer insulating layer 126 may be provided to expose a top surface of the insulating pattern 122.

When viewed in a plan view, a storage node contact BC may be provided on the active region AR of the substrate 100 exposed between the bit lines BL adjacent to each other. The storage node contact BC may be provided to penetrate the second interlayer insulating layer 126, the first interlayer insulating layer 116, and the substrate 100 and thereby be in contact with the source/drain regions 30, which are formed in the active region AR. Each storage node contact BC may be in contact with both of the source/drain regions 30 that are positioned adjacent to both sidewalls of each of the word lines WL. In detail, a pair of first and second source/drain regions 30a and 30b, which are separated from each other by the word lines WL, may be provided between the first and second node contacts DCC1 and DCC2 facing each other in the third direction Z. The first source/drain region 30a may be disposed adjacent to the first node contacts DCC1, and the second source/drain region 30b may be disposed adjacent to the second node contacts DCC2, such that between a particular first node contact DCC1 and a particular second node contact DCC2 in the third direction Z, a first source/drain region 30a is closer to the first node contact DCC1, and a second source/drain region 30b is closer to the second node contact DCC2. The storage node contact BC may be in common contact with the first source/drain region 30a and the second source/drain region 30b. A third source/drain region 30a and a fourth source/drain region 30b may be in contact with additional node contacts DCC1 and DCC2 respectively. A width of the storage node contact BC in the first direction X may be larger than or equal to that of the active region AR in the first direction X. The storage node contact BC may be provided, for example, in the form of a pillar.

The capacitor CP may be provided on the second interlayer insulating layer 126. Each capacitor CP may be provided on the active region AR exposed between adjacent bit lines BL, to contact the storage node contact BC. The capacitor CP may include a lower electrode 130, a dielectric layer 132, and an upper electrode 134. For example, the lower electrode 130 may be provided on the storage node contact BC. The lower electrode 130 may contact the storage node contact BC. The dielectric layer 132 may be provided on the second interlayer insulating layer 126 to conformally cover a surface of the lower electrode 130. The upper electrode 134 may be provided on the dielectric layer 132.

In example embodiments, the capacitor CP may include a first capacitor CP1 and a second capacitor CP2. The first capacitor CP1 may be provided to cross one of the first and third word lines WL1 and WL3 in the first direction X. The first capacitors CP1 adjacent to each other in the first direction X may be arranged spaced apart from each other in the first direction X. The second capacitor CP2 adjacent to the first capacitor CP1 in the second direction Y may be provided to cross one of the second and fourth word lines WL2 and WL4 in the first direction X. The second capacitors CP2 may be spaced apart from, but adjacent to, each other in the first direction X. In certain embodiments, the first capacitors CP1 and the second capacitors CP2 may be arranged along the second direction Y to have coordinates different from each other in the first direction X. For example, when viewed in a plan view, the capacitors CP may be formed to have a honeycomb or zigzag arrangement.

Figure 2C:
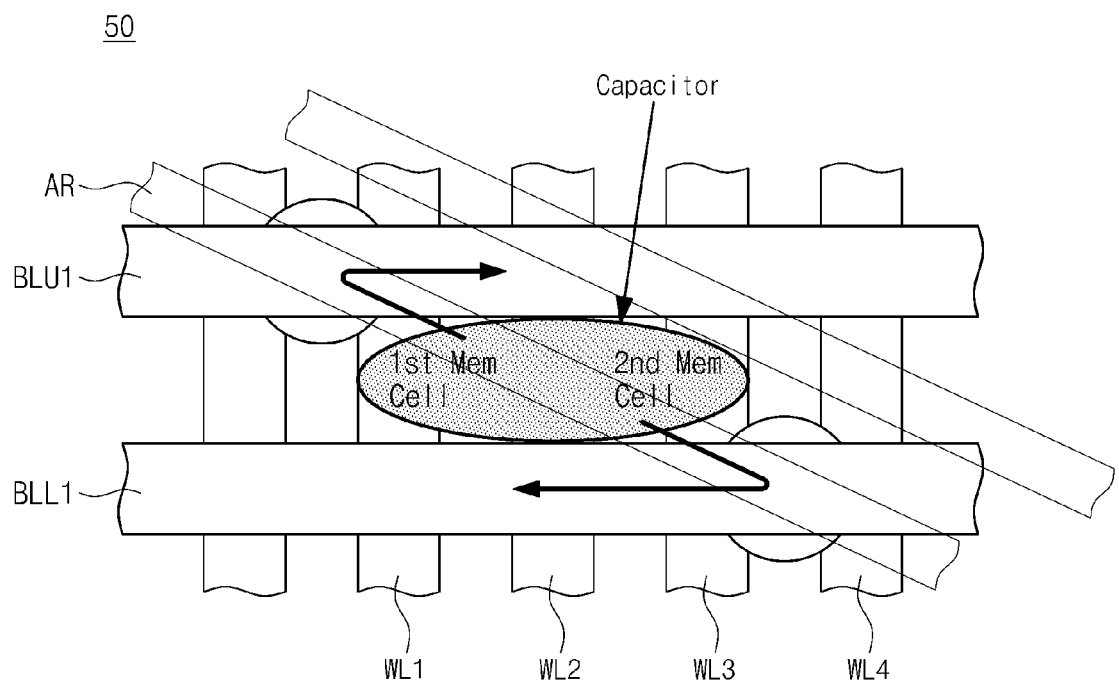
FIG. 2C illustrates an example of a multi-level memory cell according to certain embodiments.

FIG. 2C depicts an example of a multi-level memory cell (MLC) according to certain embodiments. For example, as shown in FIG. 2C, and consistent with the discussion of FIGS. 2A and 2B above, a multi-level memory cell 50 may be formed along active region AR, between a first word line WL1 and a third word line WL3, and between a first bit line BLU1 and a second bit line BLL1. The multi-level memory cell may include a first memory cell, connected directly to word line WL1 and bit line BLU1 and a second memory cell, connected directly to word line WL3 and bit line BLL1, both of which use the same capacitor for storage. In certain embodiments, a second word line WL2, disposed physically between the first word line WL1 and the third word line WL3, is not functionally part of the multi-level memory cell 50.

According to example embodiments of the inventive concept, the capacitor CP may be singly disposed between two memory cells, and this sharing of a capacitor for two memory cells (e.g., for two transistors) makes it possible to increase an area for the capacitor CP (e.g. as compared to having a smaller capacitor corresponding one-to-one to a transistor for each memory cell). As a result, the capacitor CP can be formed to have an increased electrostatic capacitance.

By virtue of the increase in area of the storage node contact BC, it is possible to omit a process of forming a landing pad between the capacitor and the storage node contact, thus securing additional area for the capacitor CP.

FIGS. 3A through 9A are plan views illustrating a method of fabricating a semiconductor device according to example embodiments of the inventive concept. FIGS. 3B through 9B are cross-sectional views taken along lines I-I', II-II' and III-III' of FIGS. 3A through 9A, respectively, to illustrate a method of fabricating a semiconductor device according to example embodiments of the inventive concept.

Figure 3A:
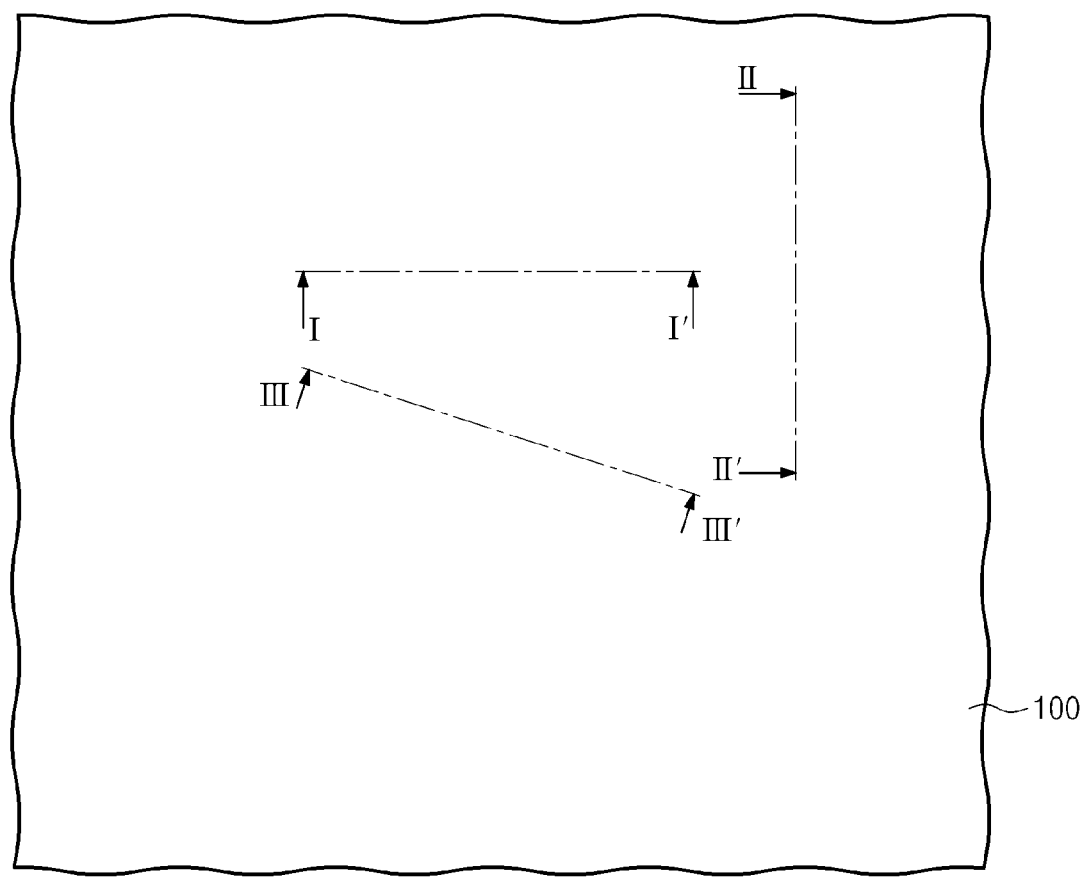
Figure 3A:
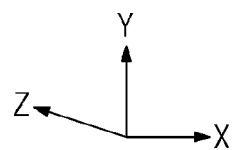
Figure 3B:
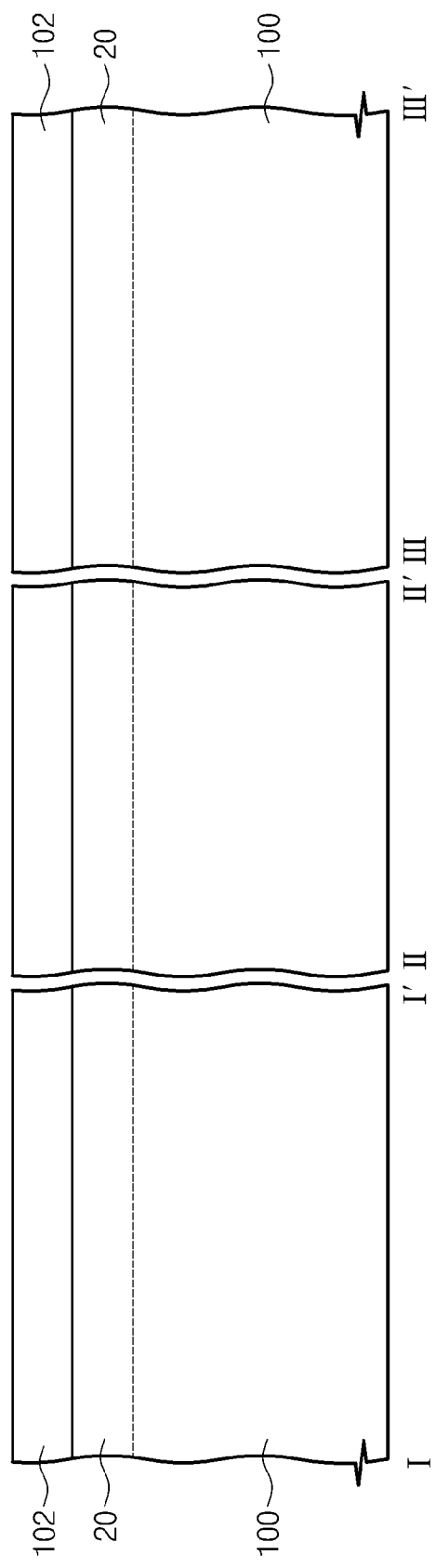

Referring to FIGS. 3A and 3B, an impurity region 20 may be formed in the substrate 100. The substrate 100 may be, for example, a bulk silicon substrate, a silicon-on-insulator (SOI) substrate, a germanium substrate, a germanium-on-insulator (GOI) substrate, a silicon-germanium substrate, or a substrate epitaxially grown using a selective epitaxial growth (SEG) technique. The impurity region 20 may be formed in an upper portion of the substrate 100 using, for example, an ion implantation process, and may be formed to have a conductivity type different from that of the substrate 100. In other example embodiments, the impurity region 20 may be formed in a subsequent process.

A sacrificial layer 102 may be formed on the substrate 100. The sacrificial layer 102 may include at least one insulating layer. In certain embodiments, the sacrificial layer 102 may be formed of a material having an etch selectivity with respect to at least one of the substrate 100 and a device isolation layer, which will be formed through a subsequent process. The sacrificial layer 102 may be formed of or include, for example, a silicon oxide layer, a silicon nitride layer, or a silicon oxynitride layer or may be a multi-layered structure including at least two thereof.

Figure 4A:
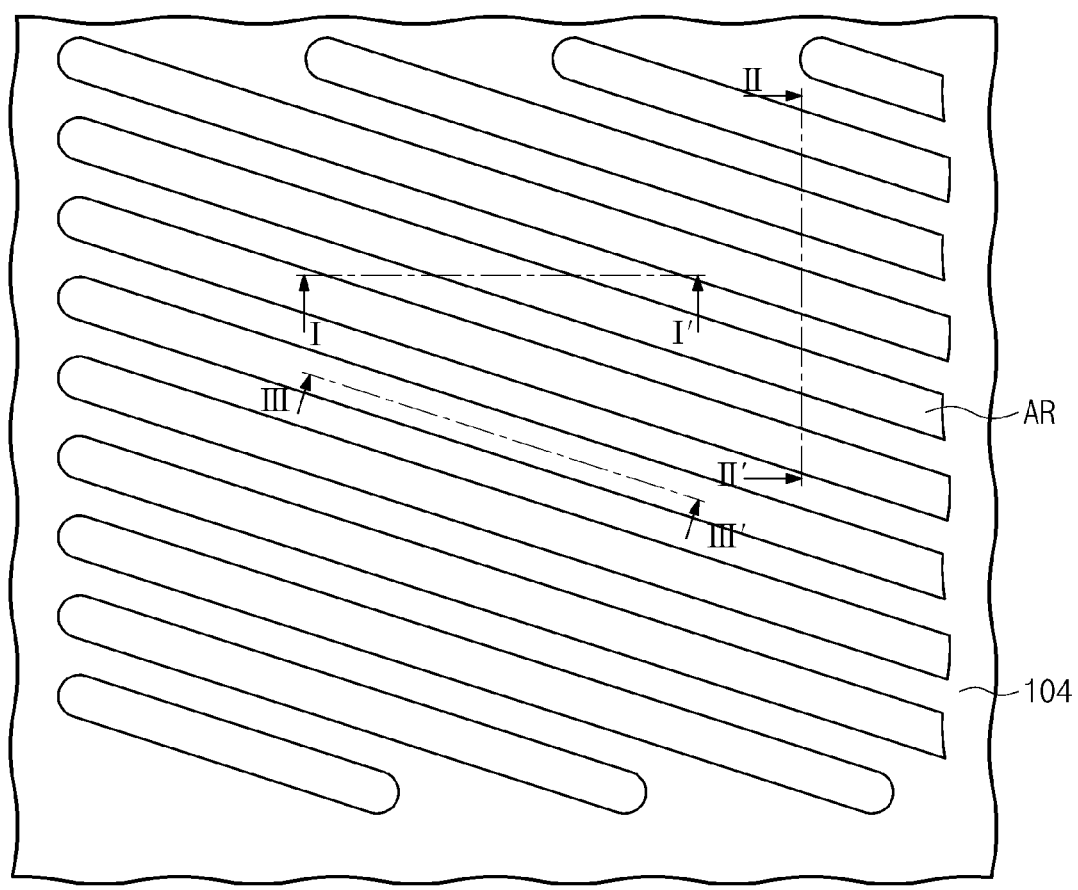
Figure 4B:
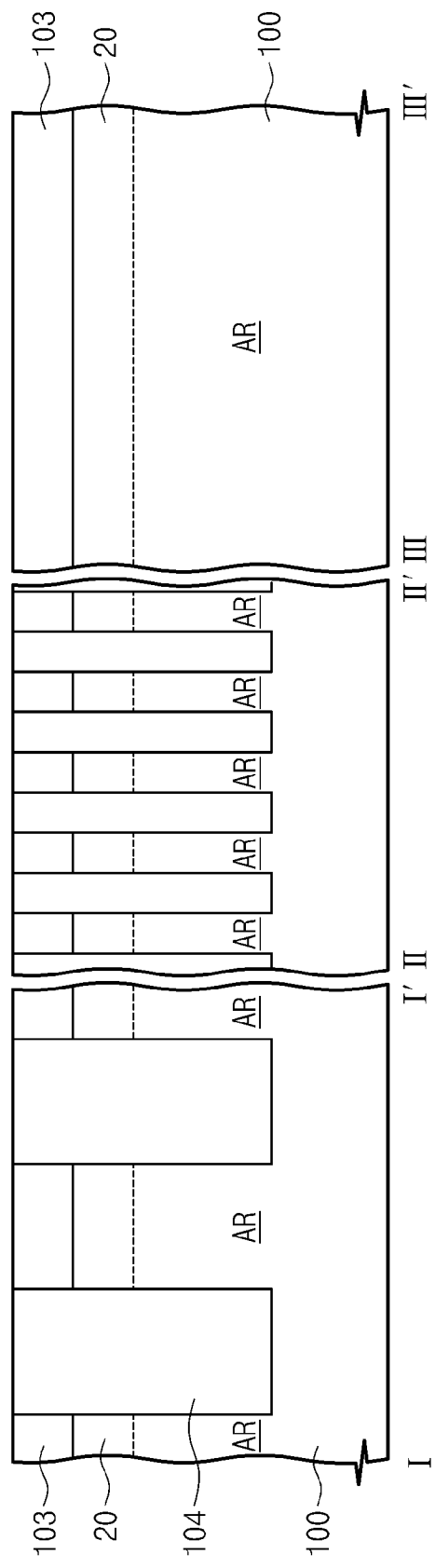

Referring to FIGS. 4A and 4B, the device isolation layer 104 may be formed on the substrate 100. The device isolation layer 104 may be formed to define the active region AR of the substrate 100. The formation of the device isolation layer 104 may include forming trenches in the substrate 100 and filling the trenches with an insulating material. When the trenches are formed, the sacrificial layer 102 along with the substrate 100 may be etched to form the sacrificial pattern 103. A plurality of the active regions AR may be formed parallel to each other, and each of them may be shaped like a bar extending in the third direction Z, which is non-parallel and non-perpendicular to the first and second directions X and Y. The device isolation layer 104 may be formed of or include, for example, an insulative material such as silicon oxide, silicon nitride, or silicon oxynitride.

Figure 5A:
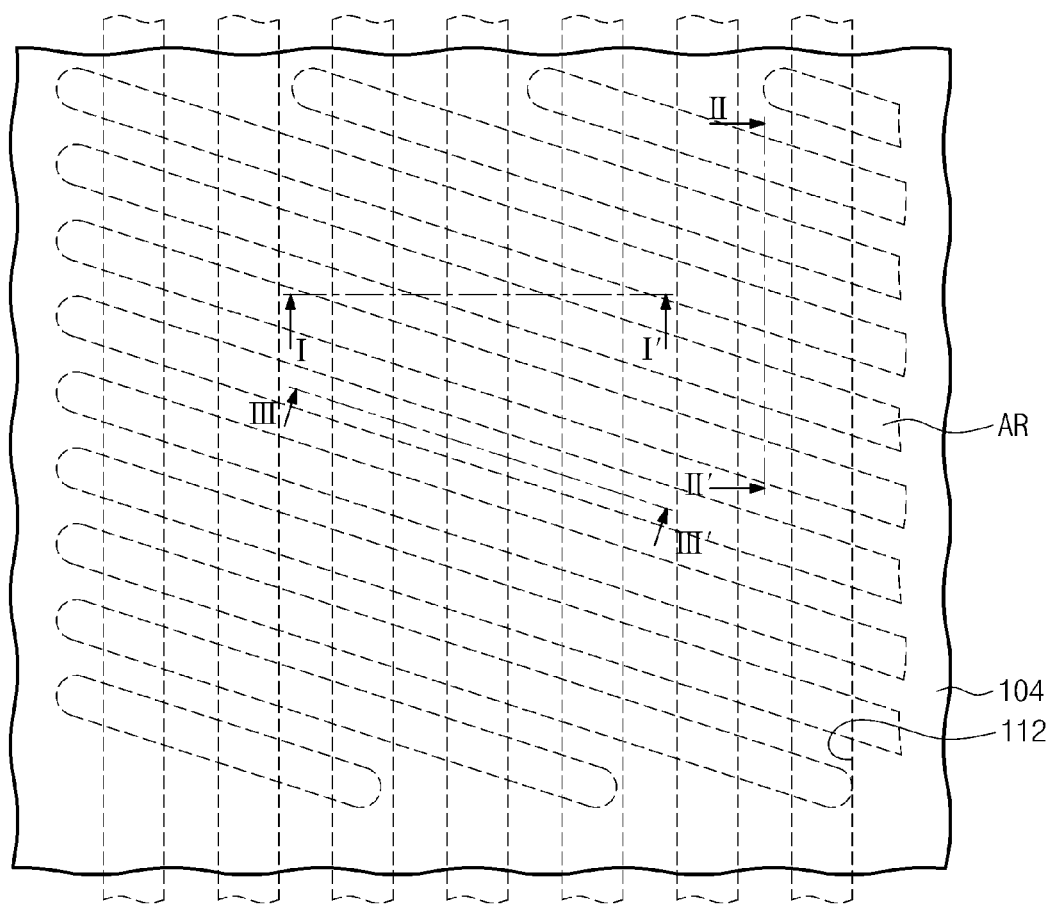
Figure 5A:
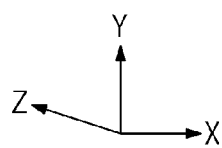
Figure 5B:
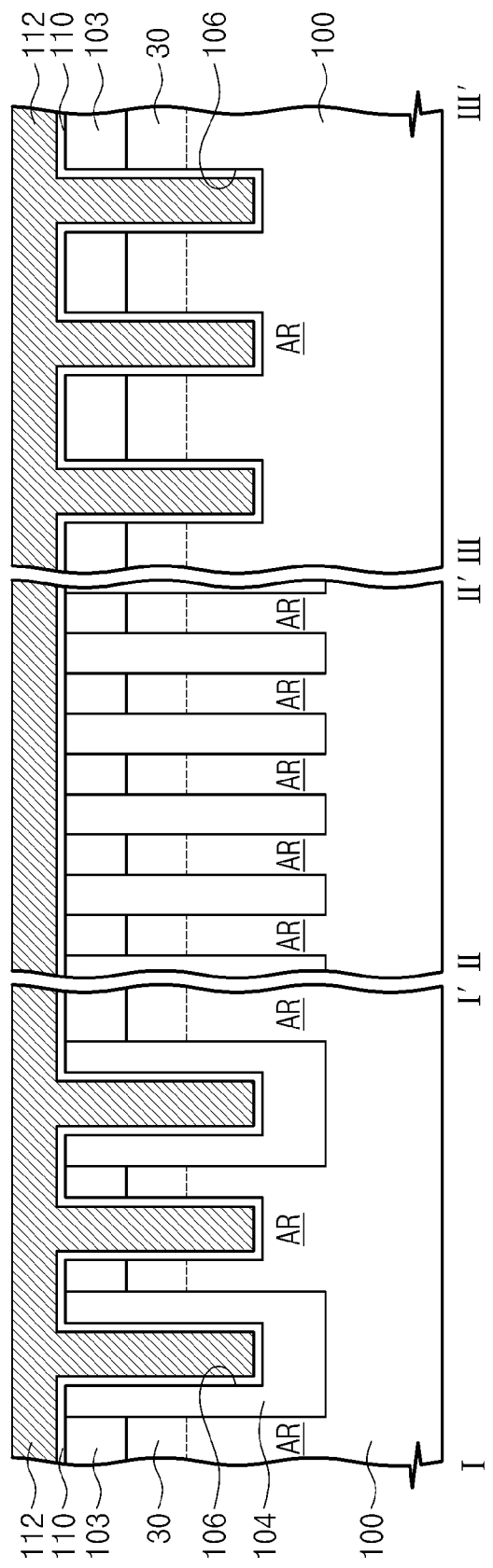

Referring to FIGS. 5A and 5B, trenches 106 may be formed in the substrate 100. The trenches 106 may be formed to cross the active region AR in the second direction Y perpendicular to the first direction X and may be arranged along the first direction X to be parallel to each other. The trenches 106 may be formed to have a depth smaller than that of the device isolation layer 104. As a result of the formation of the trenches 106, the impurity region 20 may be divided into a plurality of source/drain regions 30. A gate insulating layer 110 may be formed on the substrate 100 to conformally cover the trenches 106. Thereafter, a gate electrode layer 112 may be formed on the gate insulating layer 110 to fill the trenches 106. The gate insulating layer 110 may be formed of at least one insulating material, such as a thermal oxidation layer. The gate electrode layer 112 may be formed of at least one conductive material, such as doped poly silicon, metals, or metal silicides.

Figure 6A:
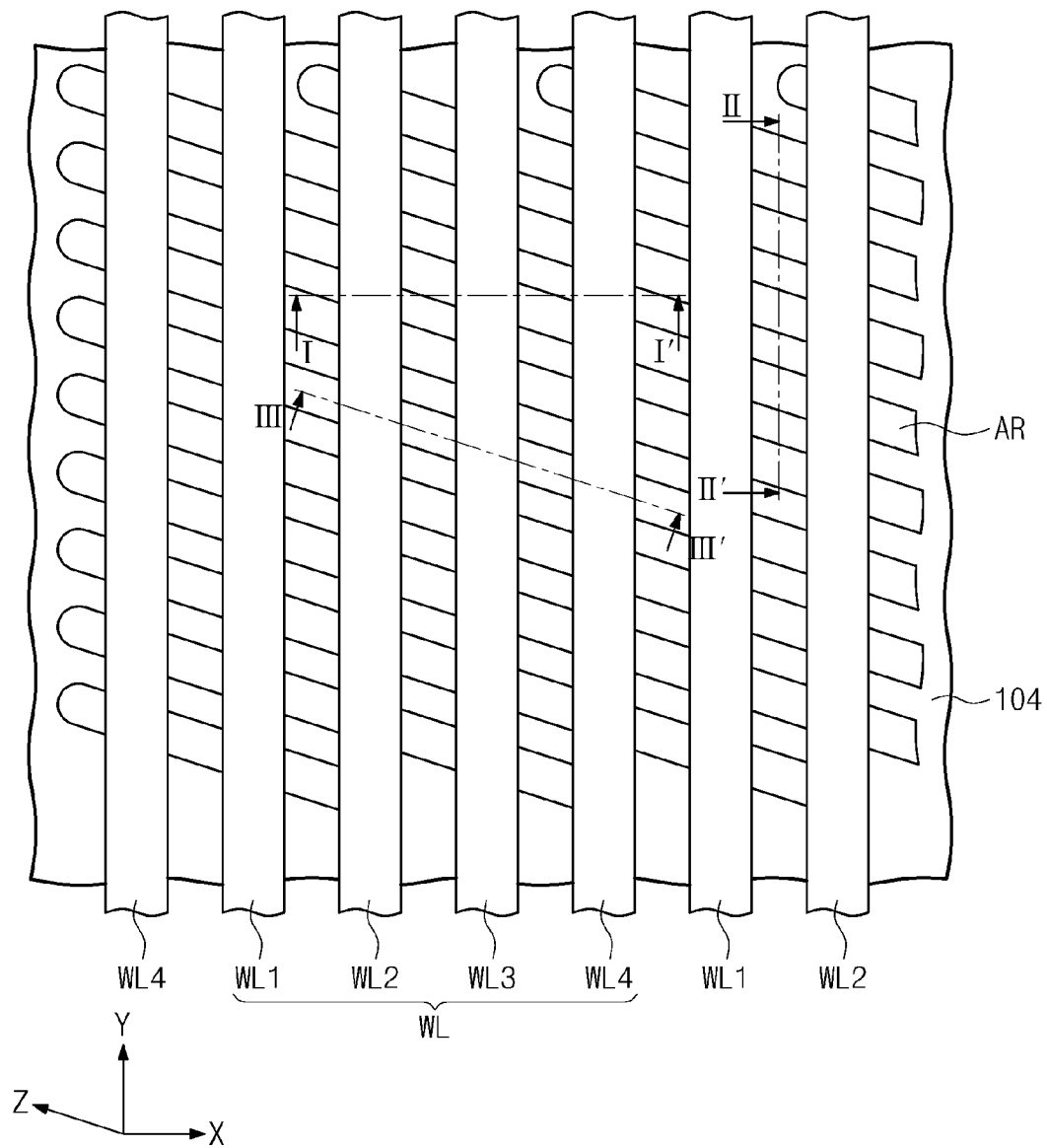
Figure 6B:
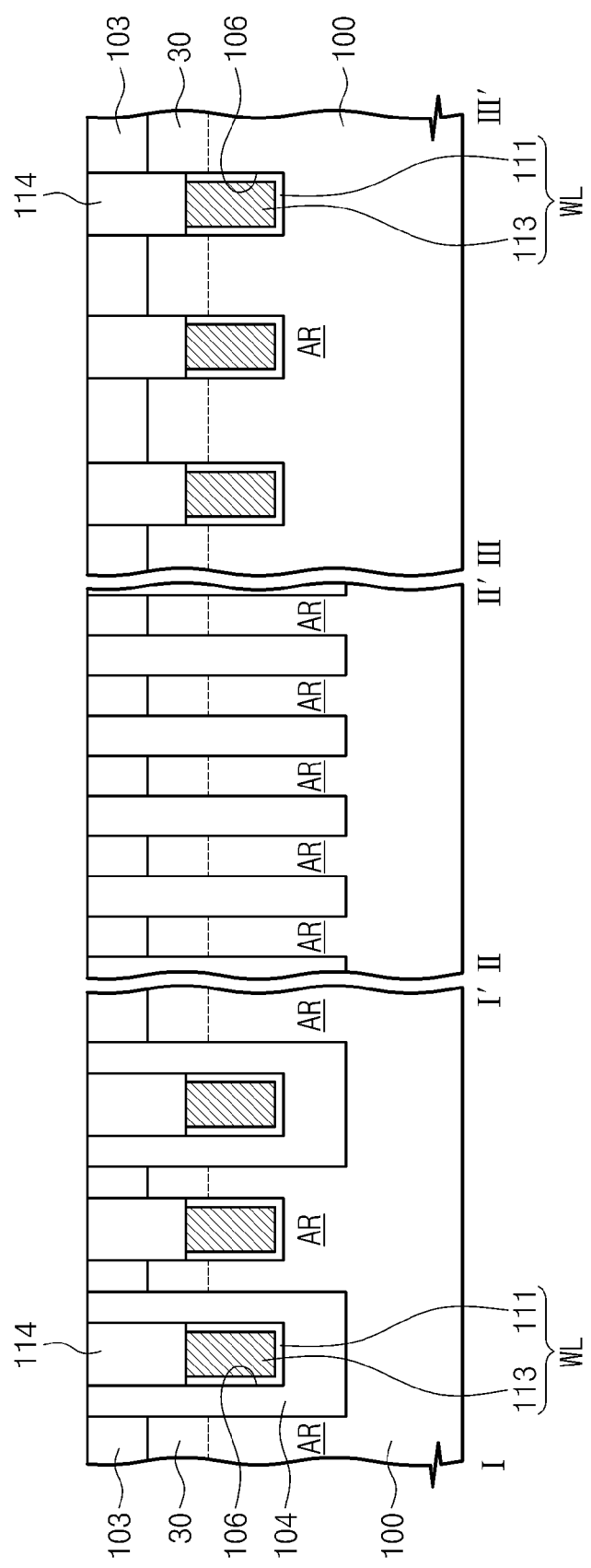

Referring to FIGS. 6A and 6B, the gate electrode layer 112 and the gate insulating layer 110 may be etched to form the word lines WL in the trenches 106. Each of the word lines WL may include the gate insulating pattern 111 and the gate electrode pattern 113. In detail, the gate insulating pattern 111 and the gate electrode pattern 113 may be portions of the gate insulating layer 110 and the gate electrode layer 112, respectively, which are formed in the trench 106. For example, the gate insulating pattern 111 and the gate electrode pattern 113 may be formed by etching the gate insulating layer 110 and the gate electrode layer 112 using, for example, a chemical-mechanical polishing (CMP) process or an etch-back process. The word lines WL may form a plurality of word line groups, each group including the first to fourth word lines WL1-WL4 sequentially disposed along the first direction X. The designation of the word lines as WL1-WL4 herein is for ease of explanation of the relationship to and disposition of node contacts DCC, capacitors CP, and contact holes H as they are relative to adjacent word lines. The intent is therefore not to limit the memory cell array of example embodiments to only groups of four operable word lines.

Upper portions of the word lines WL may be partially etched to expose upper side surfaces of the trenches 106. Thereafter, the buffer insulating pattern 114 may be formed by re-filling the trenches 106 with an insulating material. The buffer insulating pattern 114 may be formed of or include, for example, silicon oxide, silicon nitride, or silicon oxynitride.

Figure 7A:
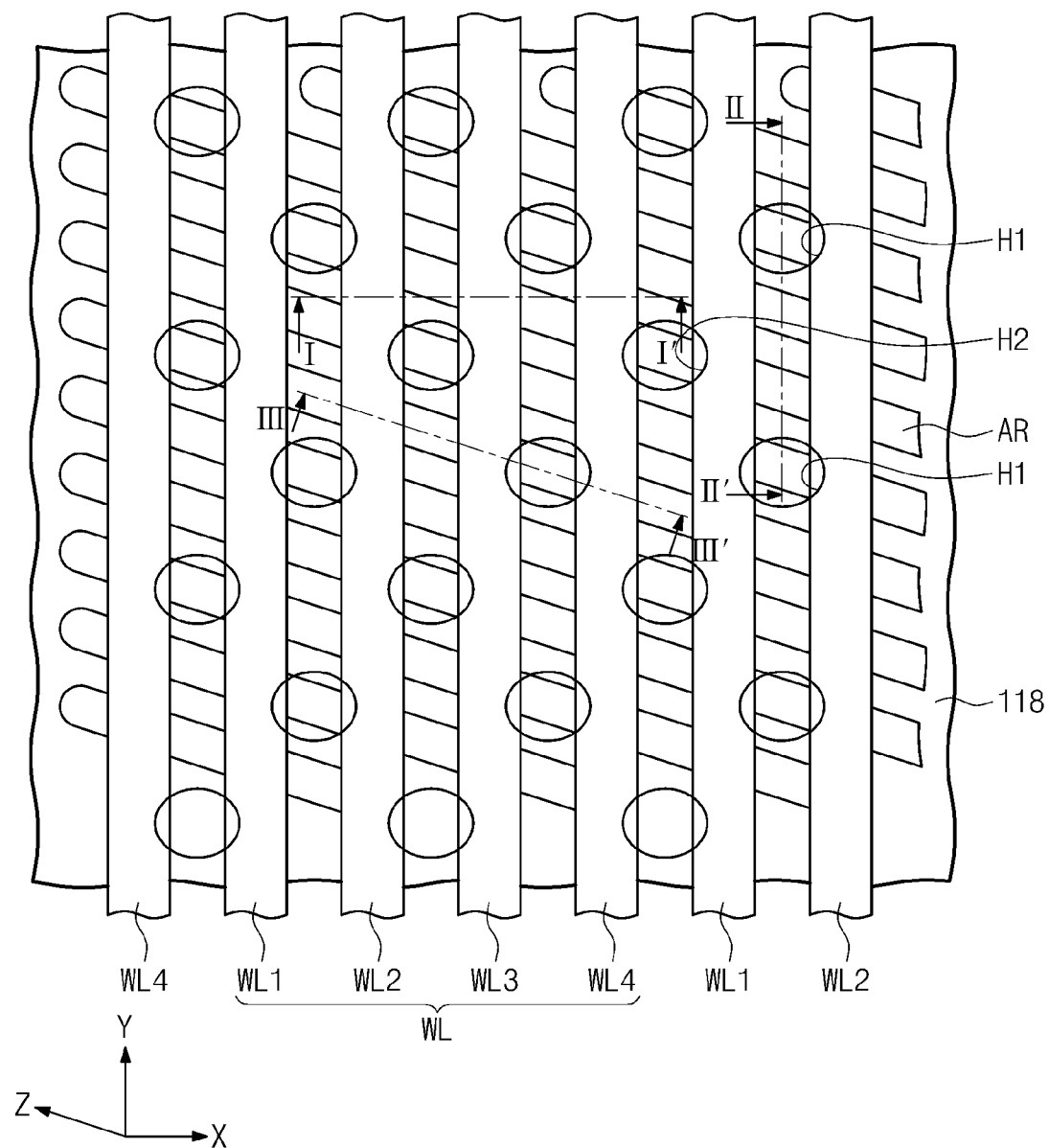
Figure 7B:
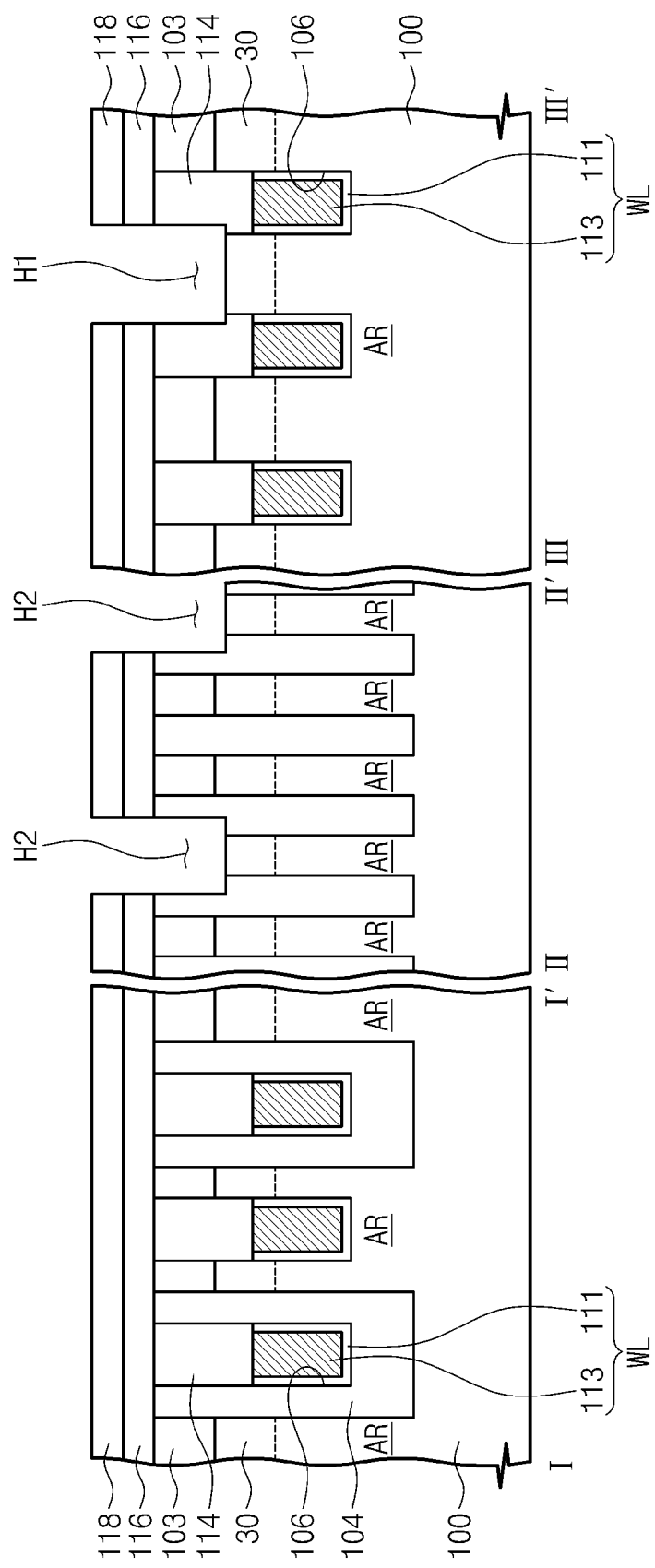

Referring to FIGS. 7A and 7B, the first interlayer insulating layer 116 and a mask pattern 118 may be formed on the substrate 100. The mask pattern 118 may be formed to have openings. Each of the openings may be formed to expose a portion of the first interlayer insulating layer 116. The first interlayer insulating layer 116 may be formed, for example, of a silicon oxide layer, a silicon nitride layer, or a silicon oxynitride layer or may be a multi-layered structure including at least two thereof. The mask pattern 118 may include, for example, a silicon nitride layer.

The first interlayer insulating layer 116, the sacrificial pattern 103, and the substrate 100 may be sequentially etched using the mask pattern 118 to form contact holes H. The contact holes H may be formed by etching the active region AR between the word lines WL. For example, each of the contact holes H may be formed by etching the active region AR between a pair of the word lines WL crossing the active region AR.

In example embodiments, when viewed in a plan view, the contact holes H may be formed to have a honeycomb or zigzag arrangement. For example, the contact holes H may include first contact holes H1 and second contact holes H2. The first contact holes H1 may be arranged along the first direction X and each of them may be formed on the active region AR, which is exposed between the first and second word lines WL1 and WL2 or between the third and fourth word lines WL3 and WL4. The second contact holes H2 adjacent to the first contact holes H1 in the second direction Y may also be arranged along the first direction X and may be formed on the active region AR, which is exposed between the second and third word lines WL2 and WL3 or between the fourth and first word lines WL4 and WL1.

The source/drain regions 30 may be exposed by the contact holes H. The device isolation layer 104 and the buffer insulating pattern 114 adjacent to the active region AR may be etched along with the active region AR, when the contact holes H are formed. The contact holes H may be formed in such a way that bottom surfaces are positioned at a higher level than the top surfaces of the word lines WL.

Figure 8A:
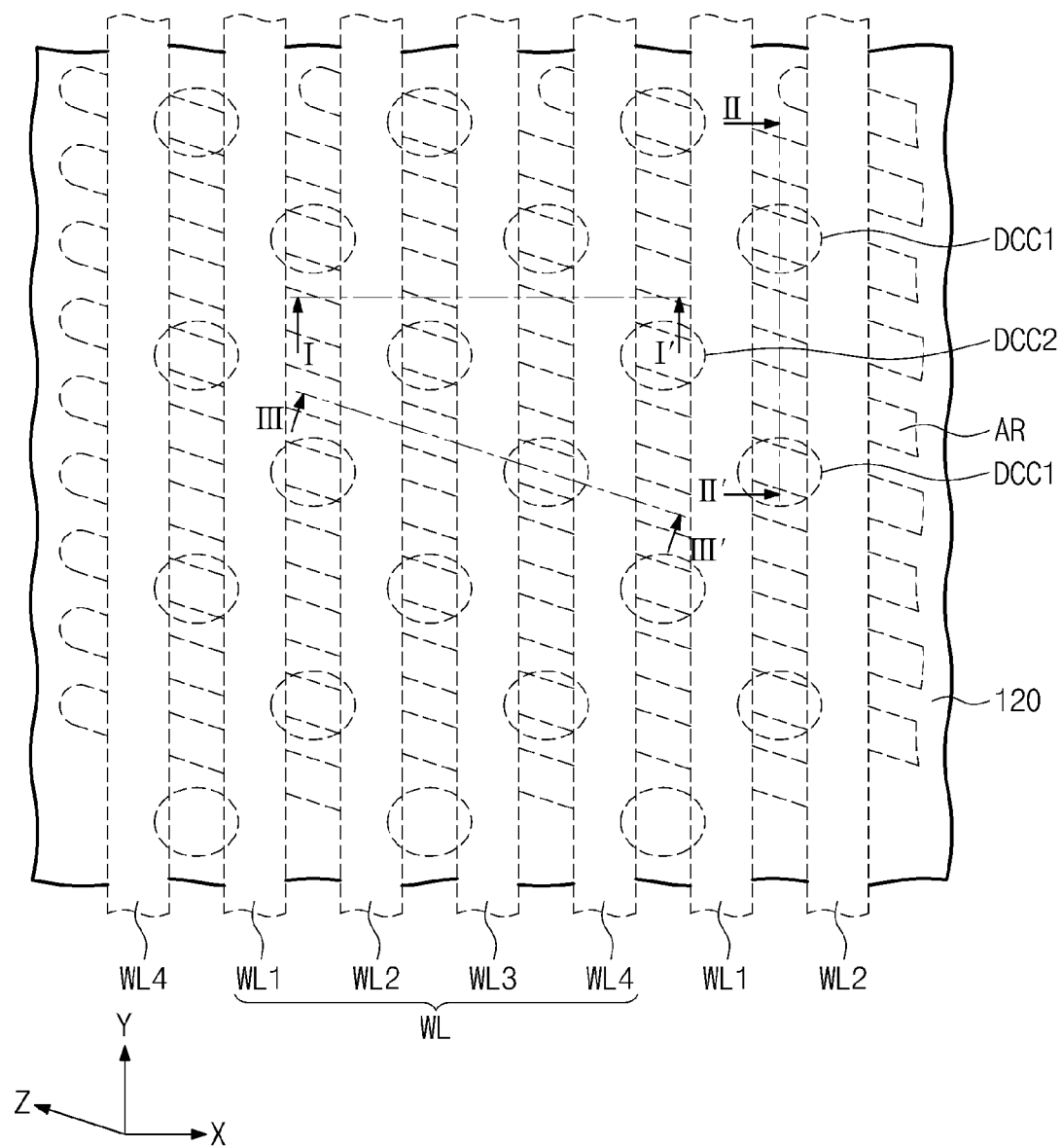
Figure 8B:
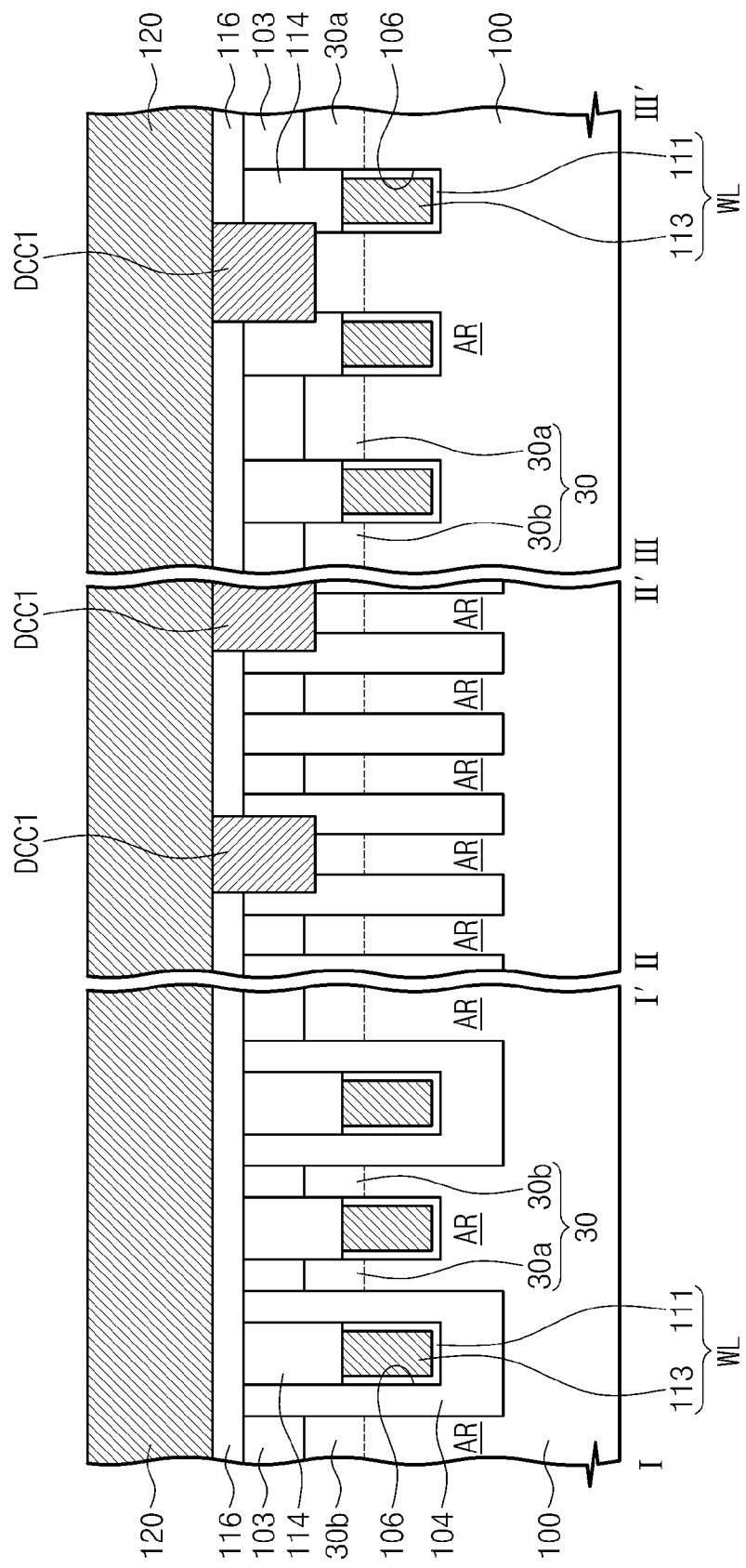

Referring to FIGS. 8A and 8B, the node contacts DCC may be formed in the contact holes H. In detail, the formation of the node contacts DCC may include forming a conductive layer (not shown) on the mask pattern 118 to fill the contact holes H and etching the conductive layer to expose the top surface of the first interlayer insulating layer 116. The node contacts DCC may include the first node contacts DCC1 respectively formed in the first contact holes H1 and the second node contacts DCC2 respectively formed in the second contact holes H2. The first source/drain region 30a and the second source/drain region 30b may be disposed on the same active region AR between the first and second node contacts DCC1 and DCC2 and face each other in the third direction Z. For example, the first source/drain region 30a may be disposed adjacent to the first node contact DCC1, and the second source/drain region 30b may be disposed adjacent to the second node contact DCC2.

In certain embodiments, the mask pattern 118 may be removed during the etching of the conductive layer. The node contacts DCC may be formed of or include at least one of, for example, metal silicide, poly silicides, metal nitrides, or metals. The etching process may be performed using, for example, an etch-back process or a CMP process.

A conductive layer 120 may be formed on the first interlayer insulating layer 116. In example embodiments, the conductive layer 120 may include a plurality of conductive layers. As an example, the conductive layer 120 may include at least two layers selected from the group including silicon (e.g., poly-silicon or doped poly-silicon), metal nitrides (e.g., TiN, Ti/TiN, TiSiN, TaN, or WN), and metals (e.g., tungsten, aluminum, copper, nickel, or cobalt).

Figure 9A:
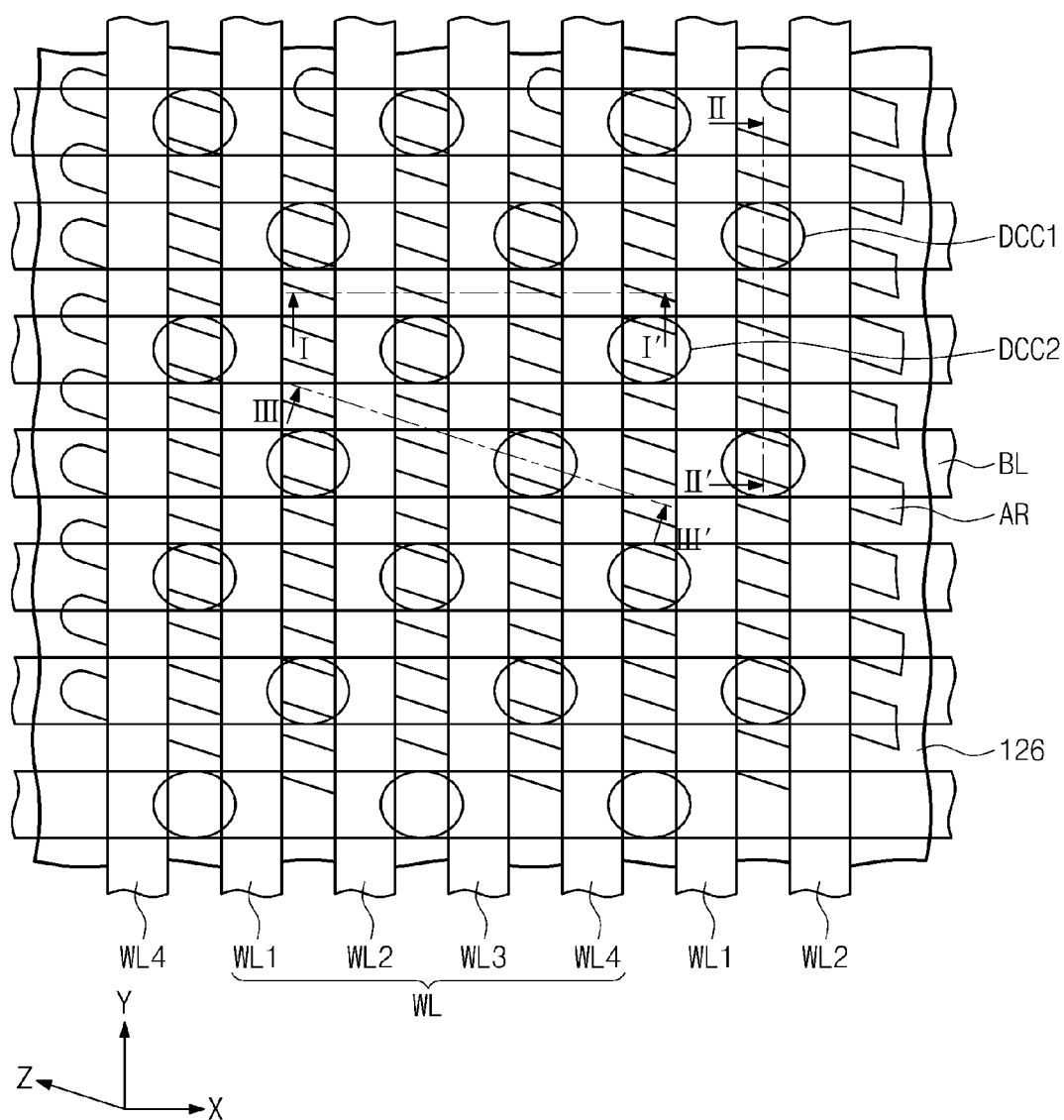
Figure 9B:
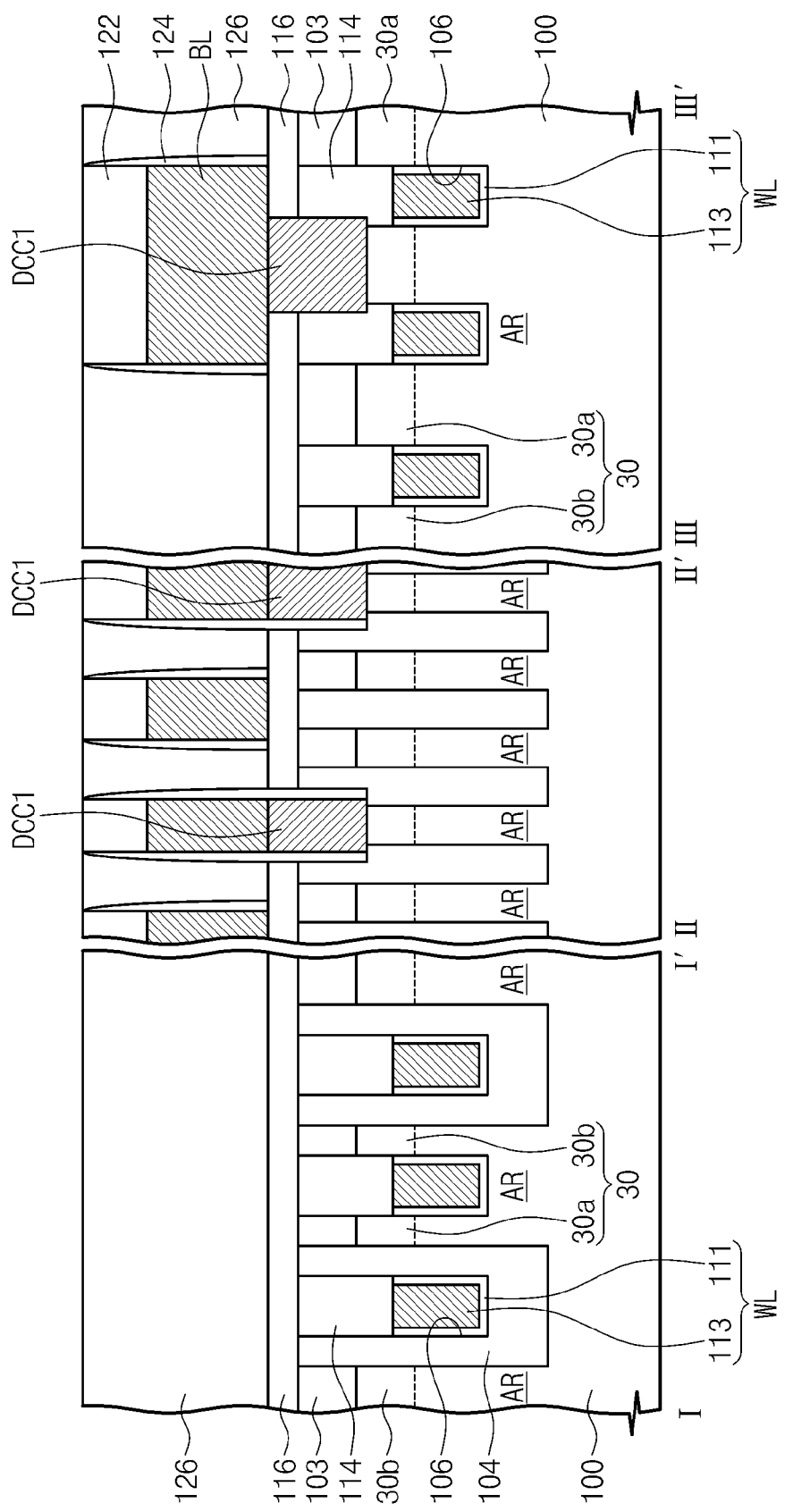

Referring to FIGS. 9A and 9B, the insulating pattern 122 may be formed on the conductive layer 120. The conductive layer 120 may be etched using, for example, the insulating pattern 122 as an etch mask to form the bit lines BL. The bit lines BL may be arranged along the second direction Y and may be formed to extend parallel to the first direction X and be parallel to each other. Each of the bit lines BL may be disposed on the node contacts DCC arranged along the first direction X to cross the active region AR. Sidewalls of the node contacts DCC may be partially etched, during the formation of the bit lines BL. Accordingly, the node contacts DCC may be locally formed in the contact holes H (i.e. in contact holes H1 and H2, shown in FIG. 7B), respectively. The insulating pattern 122 may be formed of or include, for example, silicon oxide or silicon nitride.

The spacer 124 may be formed on sidewalls of the bit lines BL. The spacer 124 may be extended to cover sidewalls of the insulating pattern 122 and the node contacts DCC. In detail, an insulating layer (not shown) may be formed on the first interlayer insulating layer 116 to conformally cover the structures formed by the node contacts DCC, the bit lines BL, and the insulating pattern 122. Then, an etch-back process may be performed on the insulating layer to form the spacer 124. The spacer 124 may be formed of or include, for example, silicon oxide or silicon nitride.

After the formation of the spacer 124, the second interlayer insulating layer 126 may be formed on the first interlayer insulating layer 116. The second interlayer insulating layer 126 may be etched to expose a top surface of the insulating pattern 122. In certain embodiments, the second interlayer insulating layer 126 may be formed of the same material as the first interlayer insulating layer 116.

Referring back to FIGS. 2A and 2B, the second interlayer insulating layer 126, the first interlayer insulating layer 116, the sacrificial pattern 103, and the substrate 100 may be etched (e.g. sequentially) to form storage contact holes BCH. The storage contact holes BCH may be formed by etching the active region AR exposed between the first and second node contacts DCC1 and DCC2 facing each other in the third direction Z and between the bit lines BL. The storage contact holes BCH may be formed to expose the first source/drain region 30a and the second source/drain region 30b. The storage contact holes BCH may be formed to have a depth smaller than those of the top surfaces of the word lines WL. For example, a vertical depth between a top surface of the first interlayer insulating layer 116 and a bottom surface of the storage contact holes BCH may be less than the vertical depth between the top surface of the first interlayer insulating layer 116 and a top surface of the word lines WL.

The storage node contacts BC may be formed by filling the storage contact holes BCH with a conductive (e.g., metallic) material. Each of the storage node contacts BC may commonly contact a pair of the first and second source/drain regions 30a and 30b, and thus, the pair of the first and second source/drain regions 30a and 30b may be electrically connected to each other, directly through the storage node contacts BC. In certain embodiments, for each transistor (Tr1 and Tr2), each source/drain region of the first and second source/drain regions 30a and 30b may be referred to as a source/drain. Each of the storage node contacts BC may be referred to as a source electrode, a drain electrode, or a source/drain electrode, depending on its function. The first and second node contacts DCC1 and DCC2 on the same active region AR adjacent to the pair of the first and second source/drain regions 30a and 30b may be nodes for connecting to two adjacent bit lines (e.g. first and second bit lines BLU1 and BLL1).

The capacitors CP may be formed on the second interlayer insulating layer 126, in which the storage node contacts BC are provided. Each of the capacitors CP may include the lower electrode 130, the dielectric layer 132, and the upper electrode 134.

The formation of the lower electrodes 130 may include forming a sacrificial layer (not shown) on the second interlayer insulating layer 126 to have holes (not shown), and then, filling the holes with a conductive material. The lower electrode 130 may be electrically connected to the storage node contact BC, on the second interlayer insulating layer 126. The lower electrode 130 may be formed of or include at least one of, for example, metals, conductive metal compounds, or doped semiconductors.

The dielectric layer 132 may be formed on the lower electrode 130. The dielectric layer 132 may be formed to conformally cover a surface of the lower electrode 130. The dielectric layer 132 may be formed by a layer-forming process (e.g., chemical vapor deposition (CVD) or atomic layer deposition (ALD)) having a good step coverage property. The dielectric layer 132 may be formed of at least one of metal oxides (e.g., $HfO_2$, $ZrO_2$, $Al_2O_3$, $La_2O_3$, $Ta_2O_3$, and $TiO_2$) or perovskite dielectric materials (e.g., STO ($SrTiO_3$), BST (($Ba,Sr)TiO_3$), $BaTiO_3$, PZT, and PLZT).

The upper electrode 134 may be formed on the dielectric layer 132. The upper electrode 134 may be formed by a layer-forming process (e.g., chemical vapor deposition (CVD) or atomic layer deposition (ALD)) having a good step coverage property. The upper electrode 134 may include at least one of doped silicon, metal materials, metal nitrides, or metal silicides. As an example, the upper electrode 134 may be formed of or include at least one of refractory metals (e.g., cobalt, titanium, nickel, tungsten, or molybdenum). As other examples, the upper electrode 134 may be formed of a metal nitride layer (e.g., of titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), or tungsten nitride (WN)). The upper electrode 134 may be formed of at least one noble metal selected from the group including platinum (Pt), ruthenium (Ru) and iridium (Ir). Further, the upper electrode 134 may be formed of at least one of precious metal conductive oxides (e.g., PtO, $RuO_2$, and $IrO_2$) and conductive oxides (e.g., SRO ($SrRuO_3$), BSRO (($Ba,Sr)RuO_3$), CRO $CaRuO_3$, and LSCo). After the formation of the upper electrode 134, a plasma treatment process and a thermal treatment process may be performed to remove impurities, which may be produced when an upper electrode is deposited. Plasma of N2 and H2 gas may be used in the plasma treatment process.

Figure 10:
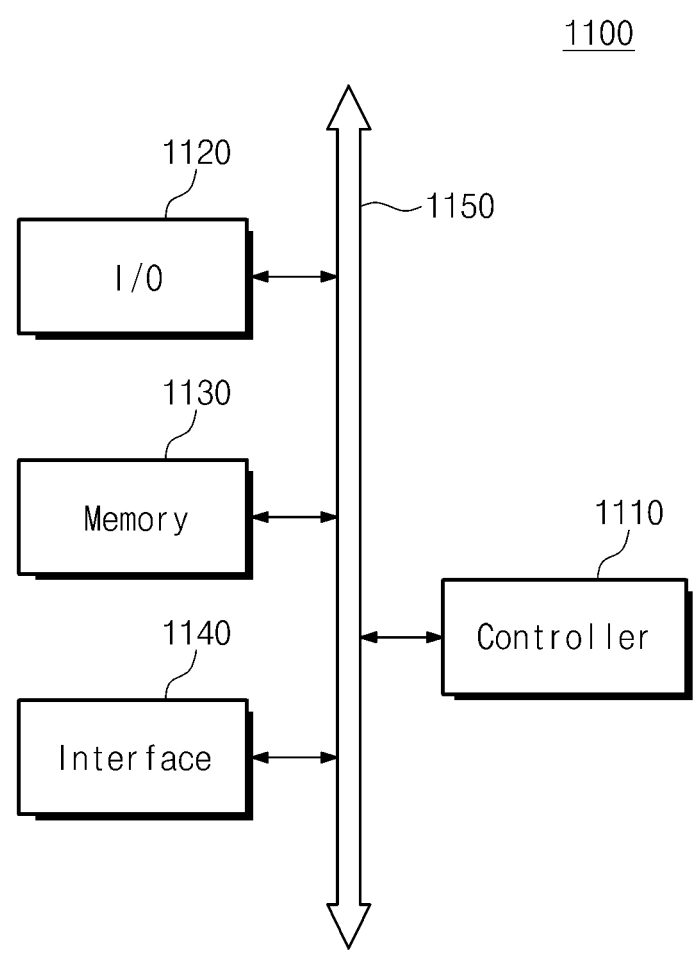
FIG. 10 is a schematic block diagram illustrating an example of memory systems including a semiconductor device according to example embodiments of the inventive concept.

FIG. 10 is a schematic block diagram illustrating an example of memory systems including a semiconductor device (e.g. the memory cell array of FIG. 1A) according to example embodiments of the inventive concept.

Referring to FIG. 10, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication. At least one of the controller 1110, the input-output unit 1120, the memory device 1130, and/or the interface 1140 may form a semiconductor device according to example embodiments of the inventive concept.

The controller 1110 may include, e.g., at least one of a microprocessor, a digital signal processor, a microcontroller, or another logic device, which is configured to have a similar function to any one of the microprocessor, the digital signal processor, and the microcontroller. The input-output unit 1120 may include a keypad, keyboard, touchpad, a display device, and so forth. The memory device 1130 may be configured to store data and/or commands. The interface unit 1140 may transmit electrical data to a communication network or may receive electrical data from a communication network. The interface unit 1140 may operate in a wired or wireless manner. For example, the interface unit 1140 may include an antenna for wireless communication or a wireless transceiver for wireless communication. Although not shown in the drawings, the electronic system 1100 may further include a fast DRAM device and/or a fast SRAM device, which acts as a cache memory for improving an operation of the controller 1110.

The electronic system 1100 may be applied to an electronic device such as a personal digital assistant (PDA), a portable computer, a web tablet, a wireless phone, a mobile phone, a smart phone, a digital music player, a memory card, or any other electronic product configured to receive or transmit information data, for example wirelessly.

Figure 11:
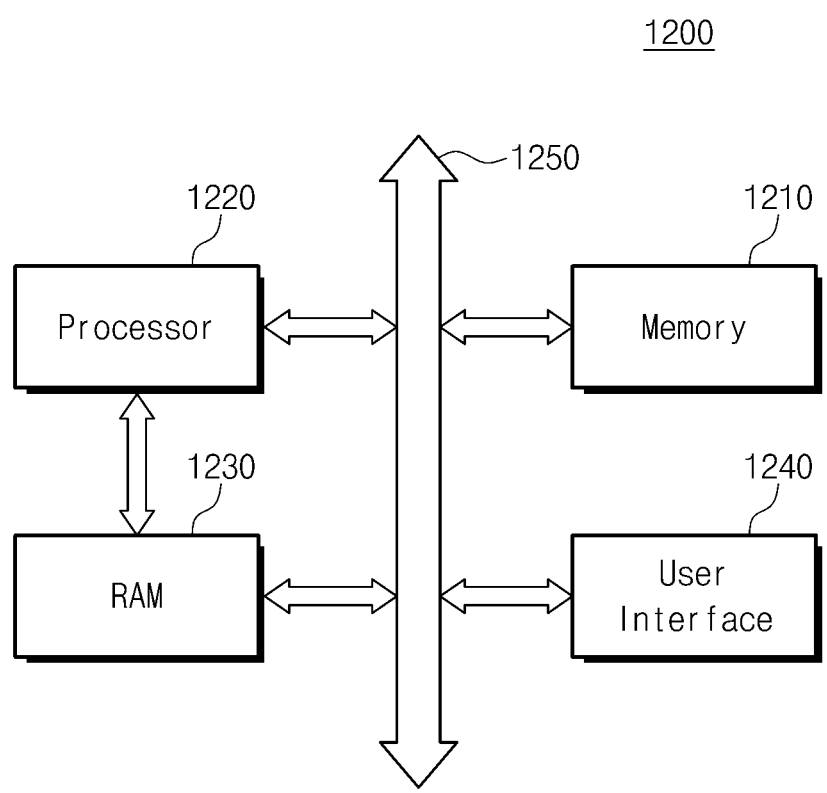
FIG. 11 is a schematic block diagram illustrating an example of electronic systems including a semiconductor memory device according to embodiments of the inventive concept.

FIG. 11 is a schematic block diagram illustrating an example of electronic systems including a semiconductor memory device according to certain embodiments of the inventive concept.

Referring to FIG. 11, an electronic system 1200 may include at least one of the semiconductor memory devices according to the embodiments mentioned above. The electronic system 1200 may include a mobile device or a computer. As an illustration, the electronic system 1200 may include a memory system 1210, a processor 1220, a random access memory (RAM) 1230, and a user interface 1240 that that are electrically connected to a bus 1250. The processor 1220 may be configured to execute programs and control the electronic system 1200. The RAM 1230 may be used as an operating memory of the processor 1220. For example, one or more of the processor 1220 and the RAM 1230 may include the semiconductor device according to example embodiments of the inventive concept. Alternatively, the processor 1220 and the RAM 1230 may be provided as components of a semiconductor package. The user interface 1240 may be used to input/output data to/from the electronic system 1200. The memory system 1210 may be configured to store code for operating the processor 1220, data processed by the processor 1220 or data inputted from the outside. The memory system 1210 may include a controller and a memory device.

The electronic system 1200 may be realized as a mobile system, a personal computer, an industrial computer, or a logic system performing various functions. For example, the mobile system may be one of a personal digital assistant (PDA), a portable computer, a tablet, a wireless phone, a memory card, a mobile phone (e.g., a smart phone), a laptop computer, a digital music system, and an information transmit/receive system. When the electronic system 1200 performs wireless communication, the electronic system 1200 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

According to example embodiments of the inventive concept, two memory cells are connected to one capacitor. Since the one capacitor is disposed between two cells, it is possible to provide a large area for the capacitor. Accordingly, the capacitor can be formed to have a larger cross-sectional area and a higher capacitance than that of the conventional technology.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a first memory cell including a first transistor and a first capacitor, the first transistor comprising a first gate electrode, a first source, and a first drain;
a second memory cell including a second transistor and the first capacitor, the second transistor comprising a second gate electrode, a second source, and a second drain;
a first word line coupled to the first gate electrode;
a second word line coupled to the second gate electrode;

a third word line disposed between the first word line and the second word line;

a first bit line coupled to the first drain to cross the first and second word lines;

a second bit line coupled to the second drain and disposed parallel to the first bit line;

a third transistor including a third gate electrode, a third drain, and a third source;

a fourth transistor including a fourth gate electrode, a fourth drain, and a fourth source;

a fourth word line and a fifth word line disposed parallel to the second word line; and a third bit line disposed parallel to the second bit line, wherein the first capacitor is electrically connected between the first and second transistors, wherein the first capacitor vertically overlaps the third word line, wherein the first capacitor is shared by the first and second memory cells and is coupled in common to the first and second sources, wherein the third gate electrode is coupled to the fourth word line, the third drain is coupled to the third bit line, the fourth gate electrode is coupled to the fifth word line, and the fourth drain is coupled to the second bit line, and wherein the third and the fourth sources are coupled in common to a second capacitor.

2. The semiconductor device of claim 1, wherein the first capacitor and the second capacitor are disposed as part of a honeycomb or zigzag arrangement, when viewed in a plan view with other similarly coupled capacitors in a memory cell array.

3. The semiconductor device of claim 1, further comprising:

a first sense amplifier unit; and a second sense amplifier unit, wherein the first sense amplifier unit is connected to the first and third bit lines, and the second sense amplifier unit is connected to the second bit line.

4. The semiconductor device of claim 1, further comprising:

a first storage node contact electrically connected to the first capacitor and contacting both of the first and second sources; and a second storage node contact electrically connected to the second capacitor and contacting both of the third and fourth sources, wherein the first and second storage node contacts are disposed as part of a honeycomb or zigzag arrangement, when viewed in a plan view with other similarly connected storage node contacts in a memory cell array.

5. The semiconductor device of claim 1, wherein the first word line, second word line, third word line, and first capacitor are all formed on the same active region in a substrate, the active region defined by a device isolation layer.

6. A semiconductor device, comprising:

a substrate including an active region, which is defined by a device isolation layer, to extend in a third direction that is non-parallel and non-perpendicular to first and second directions, which are perpendicular to each other;

word lines arranged in the substrate in the first direction, the word lines extending in the second direction to cross the active region, the word lines having a first word line, a second word line, and a third word line between the first word line and the second word line;

a first bit line and a second bit line arranged on the substrate in the second direction, the first and the second bit lines extending in the first direction to cross the active region;

a storage node contact disposed on the active region between the first bit line and the second bit line, the storage node contact contacting at least a first source/drain region and a second source/drain region, the first source/drain region positioned between the first word line and the third word line in the active region and the second source/drain region positioned between the third word line and the second word line in the active region;

a capacitor provided on the storage node contact;

a third source/drain region at one side of the first word line in the active region, the third source/drain region and the first source/drain region are spaced apart from each other with the first word line interposed therebetween;

a fourth source/drain region at one side of the second word line in the active region, the fourth source/drain region and the second source/drain region are spaced apart from each other with the second word line interposed therebetween;

a first node contact electrically connected to the third source/drain region and overlapping the first bit line; and a second node contact electrically connected to the fourth source/drain region and overlapping the second bit line, wherein the capacitor is disposed to cross the third word line, when viewed in a plan view.

7. The semiconductor device of claim 6, wherein the storage node contact contacts the capacitor, wherein the capacitor is coupled between a first transistor coupled to the first word line and a second transistor coupled to the second word line.

8. The semiconductor device of claim 6, wherein, the capacitor is provided in a plurality, and wherein, when viewed in a plan view, the capacitors are disposed to have a honeycomb or zigzag arrangement.

9. The semiconductor device of claim 6, wherein the active region is provided to have a line- or bar-shaped structure, when viewed in a plan view.

10. The device of claim 6, wherein the first source/drain region and the second source/drain region are disposed between the first and second node contacts and both contact the storage node contact.

11. The device of claim 6, wherein the first source/drain region and the second source/drain region are spaced apart from each other by the third word line.

12. The semiconductor device of claim 6, further comprising:

a first memory cell including a first transistor and a first capacitor, the first transistor comprising a first gate electrode, a first source region, and a first drain region;

a second memory cell including a second transistor and the first capacitor, the second transistor comprising a second gate electrode, a second source region, and a second drain region; wherein:

the first word line is coupled to the first gate electrode, the second word line is coupled to the second gate electrode, and the first capacitor contacts the storage node contact, such that the first capacitor is electrically connected between the first and second transistors.

13. The semiconductor device of claim 12, wherein:
the first memory cell, the second memory cell, and the first capacitor are part of a multi-level memory cell configured to store data of two or more bits.

14. A multi-level memory cell configured to store data of two or more bits, the multi-level memory cell comprising:
a first transistor, the first transistor comprising a first gate electrode, a first source, and a first drain;
a second transistor, the second transistor comprising a second gate electrode, a second source, and a second drain;
a first capacitor electrically and physically between the first and second transistors;
a first word line coupled to the first gate electrode;
a second word line coupled to the second gate electrode;
a third word line physically between the first and second word lines;
a first bit line coupled to the first drain to cross the first and second word lines;
a second bit line coupled to the second drain and disposed parallel to the first bit line;
a third transistor including a third gate electrode, a third drain, and a third source;
a fourth transistor including a fourth gate electrode, a fourth drain, and a fourth source;
a fourth word line and a fifth word line disposed parallel to the second word line; and
a third bit line disposed parallel to the second bit line,
wherein the first transistor, second transistor, and first capacitor are formed along an active region extending in a direction different from the first word line and the second word line, and
wherein the first capacitor is mutually and electrically connected to the first source and the second source, on the third word line,
wherein the first capacitor is shared by the first and second memory cells and is coupled in common to the first and second sources,
wherein the third gate electrode is coupled to the fourth word line, the third drain is coupled to the third bit line, the fourth gate electrode is coupled to the fifth word line, and the fourth drain is coupled to the second bit line, and
wherein the third and the fourth sources are coupled in common to a second capacitor.

15. The multilevel memory cell of claim 14, further comprising a first storage node contact electrically connected to the first capacitor and contacting both of the first and second sources.

* * * * *